US012765415B2

(12) United States Patent
Iso

(10) Patent No.: US 12,765,415 B2
(45) Date of Patent: Oct. 13, 2026

(54) SEMICONDUCTOR DEVICE

(71) Applicant: FUJI ELECTRIC CO., LTD., Kawasaki (JP)

(72) Inventor: Akira Iso, Kai-City (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 639 days.

(21) Appl. No.: 17/874,602

(22) Filed: Jul. 27, 2022

(65) Prior Publication Data

US 2023/0098854 A1 Mar. 30, 2023

(30) Foreign Application Priority Data

Sep. 15, 2021 (JP) ................................ 2021-149899

(51) Int. Cl.
*H10W 76/40* (2026.01)
*H10W 76/136* (2026.01)

(52) U.S. Cl.
CPC ......... *H10W 76/40* (2026.01); *H10W 76/136* (2026.01)

(58) Field of Classification Search
CPC .................. H01L 23/16; H01L 23/049; H01L 23/3735; H01L 23/49811; H01L 2223/54426; H01L 2223/54486; H01L 23/24; H01L 23/544; H01L 23/053
See application file for complete search history.

(56) References Cited

U.S. PATENT DOCUMENTS 5,243,223 A 9/1993 Yamada et al.
2017/0084508 A1 3/2017 Mitsumoto et al.
2018/0033711 A1 2/2018 Hartung et al.
2018/0184538 A1* 6/2018 Bayerer ............... H05K 7/2039
2020/0243411 A1* 7/2020 Hayashida ............. H01L 23/24

FOREIGN PATENT DOCUMENTS

EP 0501341 A1 9/1992
JP S61-148845 A 7/1986
JP S62-104145 A 5/1987
JP H04-321259 A 11/1992
(Continued)

OTHER PUBLICATIONS

Espacenet translation of JP 2003068979.*
(Continued)

*Primary Examiner* — Zandra V Smith
*Assistant Examiner* — Corbyn D Mellinger
(74) *Attorney, Agent, or Firm* — Rabin & Berdo, P.C.

(57) ABSTRACT a A semiconductor device, including a board, semiconductor module disposed on a front surface of the board, and a case that includes (1) side wall portions that are disposed on the front surface of the board and that surround, with the board, a storage area including the semiconductor module, (2) a cover portion that is disposed on the side wall portions to cover the storage area, the cover portion having a terminal opening formed therein, and (3) a guiding projection portion formed on an inner surface of the cover portion, and protruding toward the storage area. The semiconductor device further includes sealing material with which the storage area is filled and which seals the semiconductor module. The guiding projection portion has a projecting end portion that is in contact with the sealing material.

19 Claims, 17 Drawing Sheets

(56) References Cited

FOREIGN PATENT DOCUMENTS

| | | | | |
|---|---|---|---|---|
| JP | 2002-299521 | A | | 10/2002 |
| JP | 2003068979 | | * | 3/2003 |
| JP | 2003068979 | A | | 3/2003 |
| JP | 2017059715 | A | | 3/2017 |
| JP | 2019-110217 | A | | 7/2019 |

OTHER PUBLICATIONS

Japanese Patent Office Action issued for corresponding JP Patent Application No. 2021-149899 on Aug. 19, 2025.
Japanese Patent Office Action issued for corresponding JP Patent Application No. 2021-149899 on Jan. 27, 2026.
Office Action issued for corresponding JP Patent Application No. 2021-149899, and its English translation, dated May 12, 2026.

* cited by examiner

SEMICONDUCTOR DEVICE

CROSS-REFERENCE TO RELATED APPLICATION

This application is based upon and claims the benefit of priority of the prior Japanese Patent Application No. 2021-149899, filed on Sep. 15, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power conversion devices. For example, these power devices are insulated gate bipolar transistors (IGBTs) and power metal-oxide-semiconductor field-effect transistors (MOSFETS). A semiconductor device includes semiconductor chips including power devices and an insulating circuit board. The insulating circuit board is stored in a case, which is to be filled with sealing material (for example, see Japanese Laid-open Patent Publication No. 61-148845).

However, such sealing material could move on components that are into contact therewith inside the semiconductor device (for example, along the inner walls of the case) and could rise in the upward direction of the semiconductor device. If a cover portion of the case has an opening through which, for example, a lead frame extends, the sealing material could seep through this opening. The surroundings of the semiconductor device are consequently smeared with this sealing material that has seeped from the semiconductor device. In addition, the sealing material soils a person handling the semiconductor device. Thus, there is a concern about deterioration in the handleability of the semiconductor device.

SUMMARY OF THE INVENTION

In one aspect of the embodiments, there is provided a semiconductor device including: a board; a semiconductor module disposed on a front surface of the board; a case that includes: side wall portions that are disposed on the front surface of the board, and that surround, with the board, a storage area in which the semiconductor module is disposed, a cover portion that is disposed on the side wall portions to cover the storage area, the cover portion having a terminal opening formed therein, and a guiding projection portion formed on an inner surface of the cover portion, and protruding toward the storage area; and sealing material with which the storage area is filled to thereby seal the semiconductor module, wherein the guiding projection portion has a projecting end portion that is in contact with the sealing material.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device in an individual drawing, terms "front surface" and "top surface" each mean an X-Y plane facing upward (+Z direction). Likewise, regarding the semiconductor device in the individual drawing, a term "up" means an upward direction (+Z direction). In addition, regarding the semiconductor device in the individual drawing, terms "rear surface" and "bottom surface" each mean an X-Y plane facing downward (−Z direction). Likewise, regarding the semiconductor device in the individual drawing, a term "down" means a downward direction (−Z direction). The above terms mean their respective directions in the other drawings, too, as needed. The terms "front surface", "top surface", "up", "rear surface", "bottom surface", "down", and "side surface" are only expressions used for the purpose of convenience to determine relative positional relationships and do not limit the technical concept of the embodiments. For example, the terms "up" and "down" may mean directions other than the vertical directions with respect to the ground. That is, the directions expressed by "up" and "down" are not limited to the directions corresponding to the gravitational force. In the following description, when a component contained in material represents 80 vol % or more of the material, this component will be referred to as the "main component" of the material.

FIRST EMBODIMENT

Figure 1:
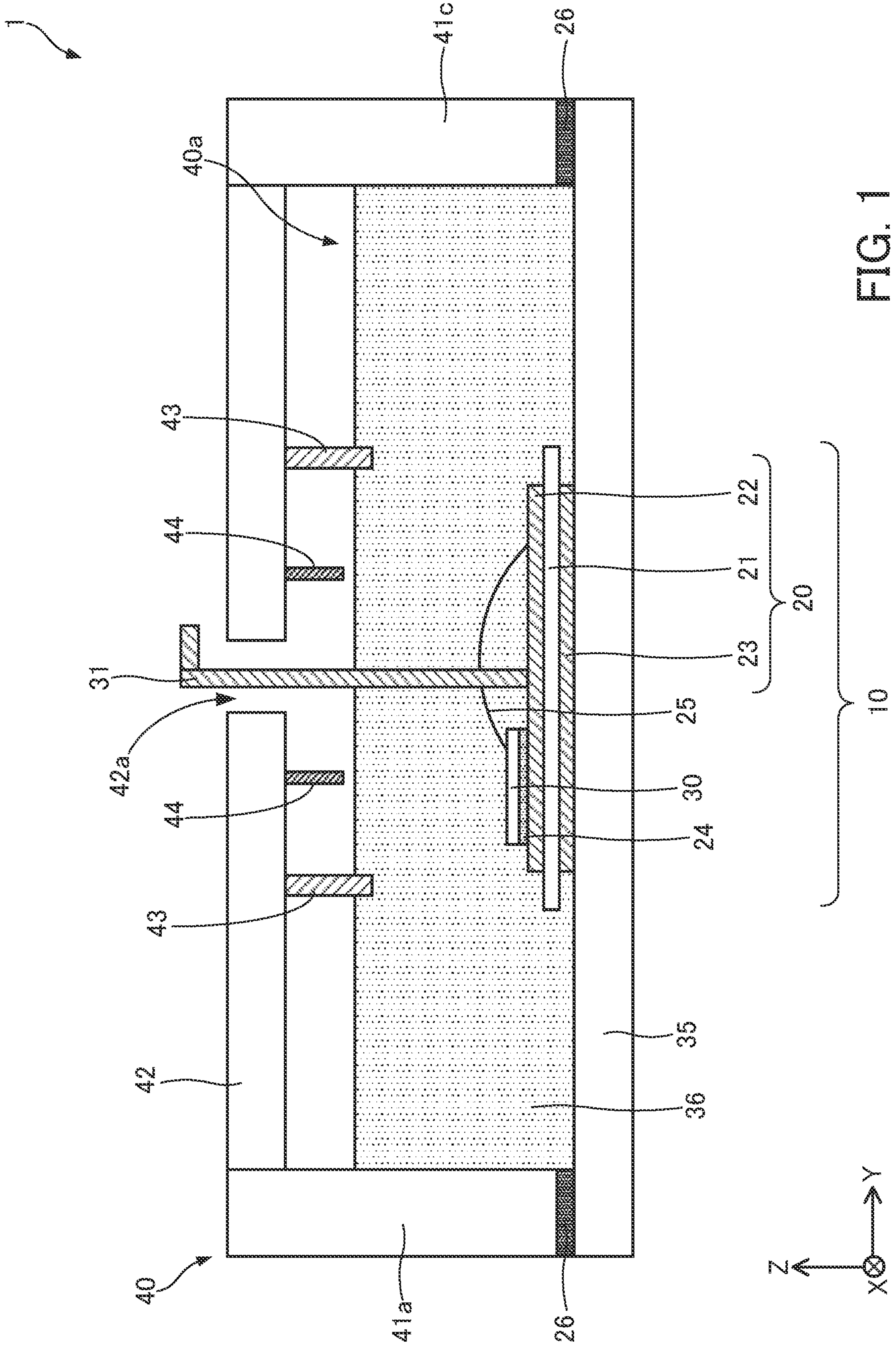
FIG. 1 is a side sectional view of a semiconductor device according to a first embodiment.
Figure 2:
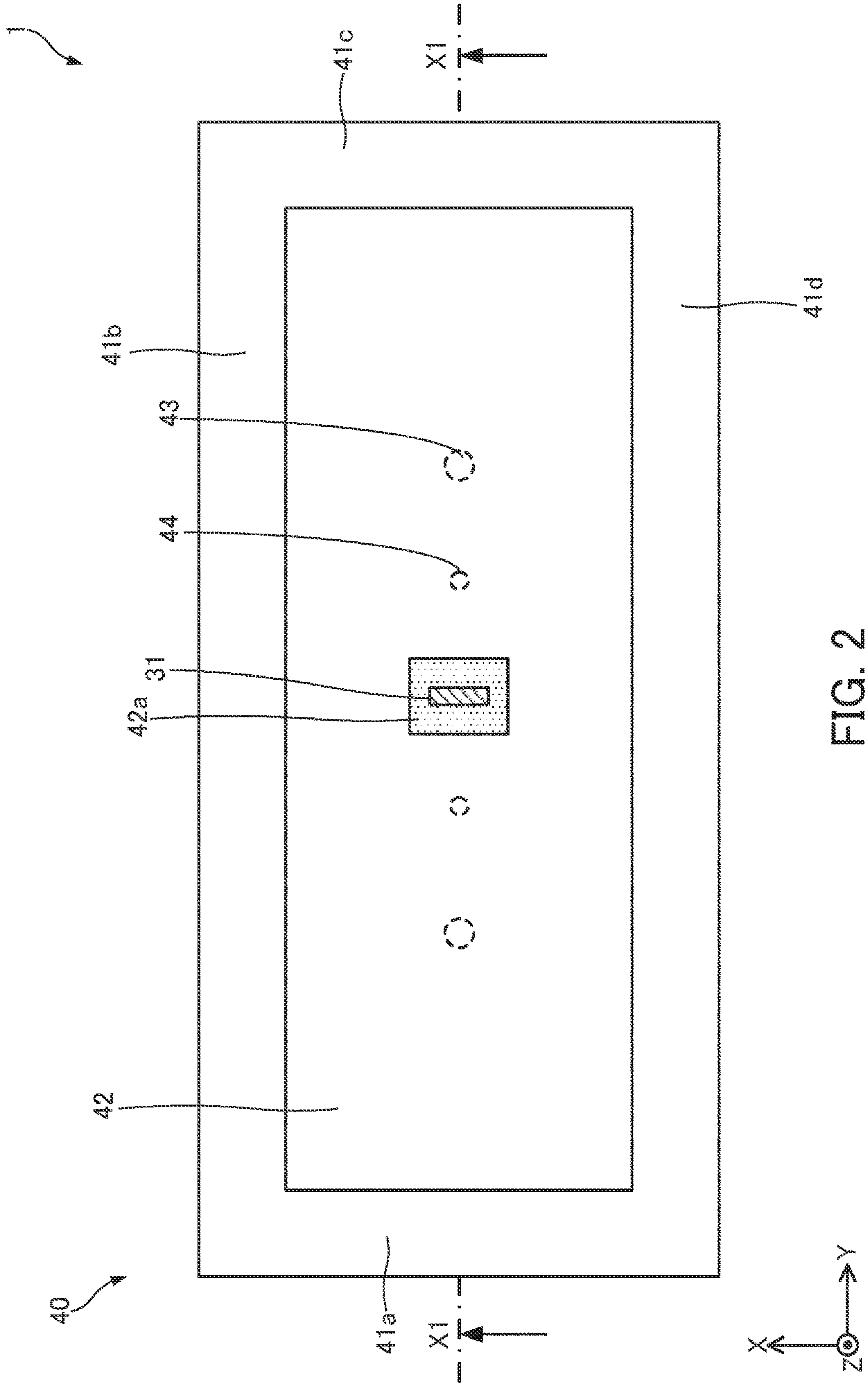
FIG. 2 is a plan view of the semiconductor device according to the first embodiment.

A semiconductor device according to a first embodiment will be described with reference to FIGS. 1 and 2. FIG. 1 is a side sectional view of the semiconductor device according to the first embodiment, and FIG. 2 is a plan view of the semiconductor device according to the first embodiment. FIG. 1 is a sectional view taken along a dashed-dotted line X1-X1 in FIG. 2. In FIG. 2, dashed lines indicate where guiding projection portions 43 and circulatory projection portions 44 are formed on the inner surface of a cover portion 42.

As illustrated in FIG. 1, this semiconductor device 1 includes a semiconductor module 10 and a heat dissipation plate 35 on which the semiconductor module 10 is disposed via solder (not illustrated). The semiconductor module 10 includes an insulating circuit board 20, semiconductor chips 30, bonding wires 25, and an external connection terminal 31. As illustrated in FIG. 1, the semiconductor chips 30 and the external connection terminal 31 are disposed on the insulating circuit board 20. Bonding wires 25 mechanically and electrically (directly) connect a plurality of semiconductor chips 30. Other bonding wires 25 mechanically and electrically (directly) connect semiconductor chips 30 and the insulating circuit board 20. In FIG. 1, a bonding wire 25 directly connecting a semiconductor chip 30 and the insulating circuit board 20 is illustrated.

The semiconductor module 10 on the heat dissipation plate 35 is covered by a case 40 of the semiconductor device 1. The insulating circuit board 20 and the semiconductor chips 30 in the case 40 are sealed by sealing material 36. The external connection terminal 31 extends to the outside through the case 40.

The insulating circuit board 20 includes an insulating plate 21, circuit patterns 22, and a metal plate 23. The insulating plate 21 and the metal plate 23 each have a rectangular shape in plan view. In addition, corners of the insulating plate 21 and the metal plate 23 may be chamfered or rounded, for example. The metal plate 23 is smaller than the insulating plate 21 in plan view and is formed inside the insulating plate 21. The insulating plate 21 has an insulating property and is made of material having excellent thermal conductivity. The insulating plate 21 is made of ceramic material or insulating resin. The ceramic material is aluminum oxide, aluminum nitride, silicon nitride, or the like. The insulating resin is a paper phenol substrate, a paper epoxy substrate, a glass composite substrate, or a glass epoxy substrate, for example. The insulating plate 21 has a thickness between 0.2 mm and 2.5 mm, inclusive.

The circuit patterns 22 are formed on the front surface of the insulating plate 21. The circuit patterns 22 are made of metal material having excellent electrical conductivity. The metal material is, for example, copper, aluminum, or an alloy containing at least one of these kinds as its main component. The circuit patterns 22 each have a thickness between 0.1 mm and 2.0 mm, inclusive. The surface of the individual circuit pattern 22 may be plated. The material used for this plating is, for example, nickel, a nickel-phosphorus alloy, or a nickel-boron alloy. The plated circuit patterns 22 have improved corrosion resistance. These circuit patterns 22 are formed on the front surface of the insulating plate 21 as follows. A metal plate is formed on the front surface of the insulating plate 21, and for example, etching is performed on this metal plate, to obtain the circuit patterns 22 having predetermined shapes. Alternatively, the circuit patterns 22 that have previously been cut out of a metal plate may be attached to the front surface of the insulating plate 21 by applying pressure. The circuit patterns 22 have been described as an example. The number of circuit patterns 22 may be selected as needed. In addition, the shapes, sizes, and locations of the circuit patterns 22 may also be selected as needed.

The metal plate 23 is formed on the rear surface of the insulating plate 21. The metal plate 23 has a rectangular shape. In plan view, the area of the metal plate 23 is smaller than the area of the insulating plate 21 but is larger than the areas where the circuit patterns 22 are formed. Corners of the metal plate 23 may be chamfered or rounded, for example. The metal plate 23 is smaller than the insulating plate 21 and is formed on the entire insulating plate 21, excepting the edge portions of the insulating plate 21. The metal plate 23 is made of metal material having excellent thermal conductivity as its main component. The metal material is, for example, copper, aluminum, or an alloy containing at least one of these kinds. The metal plate 23 has a thickness between 0.1 mm and 2.5 mm, inclusive. The surface of the metal plate 23 may be plated. The material used for this plating is, for example, nickel, a nickel-phosphorus alloy, or a nickel-boron alloy. The plated metal plate 23 has improved corrosion resistance. The metal plate 23 is formed on the rear surface of the insulating plate 21 as follows. A metal plate is formed on the rear surface of the insulating plate 21, and for example, etching is performed on this metal plate, to obtain the metal plate 23. Alternatively, the metal plate 23 that has previously been cut out of a metal plate may be attached to the rear surface of the insulating plate 21 by applying pressure. Corners of the metal plate 23 formed on the rear surface of the insulating plate 21 as described above may be chamfered or rounded.

For example, a direct copper bonding (DCB) board, an active metal brazed (AMB) board, or a resin insulating board may be used as the insulating circuit board 20 having the above structure. The insulating circuit board 20 may be attached to the front surface of the heat dissipation plate 35 via bonding material. The heat generated by the semiconductor chips 30 is transferred to the heat dissipation plate 35 via the circuit patterns 22, the insulating plate 21, and the metal plate 23 and is released to the outside. While the single insulating circuit board 20 is illustrated in FIG. 1, a plurality of insulating circuit boards 20 may be disposed as needed.

The external connection terminal 31 has a cylindrical shape, a prismatic shape, or a plate shape. The external connection terminal 31 is made of metal material having excellent electrical conductivity. The metal material is, for example, copper, aluminum, or an alloy containing at least one of these kinds as its main component. The external connection terminal 31 has a diameter (the length of a diagonal line when the external connection terminal 31 has a prismatic shape) between 0.5 mm and 2.5 mm, inclusive. When the external connection terminal 31 has a plate shape, the external connection terminal 31 has a thickness between 0.5 mm and 2.5 mm, inclusive. The surface of the external connection terminal 31 may be plated. The material used for this plating is, for example, nickel, a nickel-phosphorus alloy, or a nickel-boron alloy. The plated external connection terminal 31 has improved corrosion resistance. The external connection terminal 31 has an inner-side terminal (lower side in FIG. 1) bonded to a circuit pattern 22 via bonding material. The bonding material is solder or metal sintered material. As the solder, lead-free solder is used. The main component of the lead-free solder is, for example, an alloy containing at least two of tin, silver, copper, zinc, antimony, indium, and bismuth. In addition, the solder may contain additive, which is, for example, nickel, germanium, cobalt, or silicon. Since solder containing such additive has improved wettability, luster, and bonding strength, the reliability is improved. The metal material used for the metal sintered material is, for example, silver or a silver alloy. The external connection terminal 31 may be bonded to the circuit pattern 22 by ultrasonic bonding.

A semiconductor chip 30 includes a power device element made of silicon, silicon carbide, or gallium nitride. The semiconductor chip 30 has a thickness, for example, between 40 μm and 250 μm, inclusive. The power device element is a switching element or a diode element.

The switching element is, for example, an IGBT or a power MOSFET. For example, such a semiconductor chip 30 has a drain electrode (or a collector electrode) as its main electrode on its rear surface and has a gate electrode and a source electrode (or an emitter electrode) as its control electrode and main electrode on its front surface.

The diode element is, for example, a free wheeling diode (FWD) such as a Schottky barrier diode (SBD) or a P-intrinsic-N (PiN) diode. Such a semiconductor chip 30 has a cathode electrode as its main electrode on its rear surface and has an anode electrode as its main electrode on its front surface.

A switching element or a diode element is selected for the individual semiconductor chip 30 as needed, and the rear surface of the individual semiconductor chip 30 is directly bonded on a predetermined circuit pattern 22 via bonding material 24. The bonding material 24 is solder or metal sintered material. As the solder, lead-free solder is used. The main component of the lead-free solder is, for example, an alloy containing at least two of tin, silver, copper, zinc, antimony, indium, and bismuth. In addition, the solder may contain additive, which is, for example, nickel, germanium, cobalt, or silicon. Since solder containing such additive has improved wettability, luster, and bonding strength, the reliability is improved. The metal material used for the metal sintered material is, for example, silver or a silver alloy.

A reverse-conducting (RC)-IGBT having both of the function of an IGBT and the function of an FWD may be used as a semiconductor chip 30. For example, a lead frame, an external connection terminal (a pin terminal, a contact component, etc.), or an electronic component (a thermistor, a current sensor) may be disposed in place of or in addition to a semiconductor chip 30.

The heat dissipation plate 35 has a rectangular shape. The front surface of the heat dissipation plate 35 is substantially flat, and the insulating circuit board 20 is disposed in a center portion of the heat dissipation plate 35 via bonding material. In plan view, the area of the heat dissipation plate 35 is larger than the area of the insulating circuit board 20. Corners of the heat dissipation plate 35 may be chamfered or rounded, for example. The heat dissipation plate 35 is made of metal material or composite material having excellent thermal conductivity as its main component. The metal material is, for example, copper, aluminum, or an alloy containing at least one of these kinds. The composite material may contain metal material such as aluminum and magnesium and silicon carbide. The heat dissipation plate 35 has a thickness between 1.0 mm and 20.0 mm, inclusive. The surface of the heat dissipation plate 35 may be plated. The material used for this plating is, for example, nickel, a nickel-phosphorus alloy, or a nickel-boron alloy. The plated heat dissipation plate 35 has improved corrosion resistance.

The case 40 is attached to the periphery of the front surface of the heat dissipation plate 35 via adhesive 26. The adhesive 26 contains organic adhesive as its main component. The heat resistance temperature of the organic adhesive is approximately 100° C. between and 200° C. Specifically, the adhesive is epoxy, silicone, or acrylic adhesive. The adhesive may be paste adhesive or a sheet adhesive.

A storage area 40*a* is formed by the case 40 and the heat dissipation plate 35. The semiconductor module 10 (the insulating circuit board 20, the semiconductor chips 30, and part of the external connection terminal 31) is stored in the storage area 40*a* in the case 40. The storage area 40*a* is filled with the sealing material 36. The storage area 40*a* is filled with the sealing material 36 up to a height such that at least the semiconductor module 10 is sealed. The storage area 40*a* is filled with the sealing material 36 such that a predetermined gap is formed between the rear surface (the cover portion 42) of the case 40 and the sealing material 36.

The case 40 includes side wall portions 41*a* to 41*d* and the cover portion 42. The side wall portions 41*a* and 41*c* are disposed along the short sides of the heat dissipation plate 35, and the side wall portions 41*b* and 41*d* are disposed along the long sides of the heat dissipation plate 35. The side wall portions 41*a* to 41*d* each have a height sufficiently higher than that of the stacked insulating circuit board 20 and semiconductor chips 30.

The cover portion 42 has a flat-plate shape. The cover portion 42 is attached to the top portion of each of the side wall portions 41*a* to 41*d*. That is, the cover portion 42 covers the opening made by the side wall portions 41*a* to 41*d*, thereby covering the storage area 40*a*. A terminal opening 42*a* is formed in the cover portion 42. An outer-side terminal (upper side in FIG. 1) of the external connection terminal 31 extends through the terminal opening 42*a*. The terminal opening 42*a* may have any shape as long as the external connection terminal 31 extends through the terminal opening 42*a* without being into contact therewith. The terminal opening 42*a* has a rectangular shape or a circular shape in plan view. In the present embodiment, the terminal opening 42*a* has a rectangular shape. This shape of the terminal opening 42*a* corresponds to the cross-sectional shape of the external connection terminal 31. The terminal opening 42*a* is formed in an area of the cover portion 42, the area corresponding to the location of the external connection terminal 31 in plan view. The external connection terminal 31 is located at a center portion of the plan view and the side view in FIGS. 1 and 2. Corresponding to the location of the external connection terminal 31, the terminal opening 42*a* is also formed in a center portion of the cover portion 42. When a plurality of external connection terminals 31 are formed, a plurality of terminal openings 42*a* may be formed where the plurality of external connection terminals 31 are formed. In FIGS. 1 and 2, the single terminal opening 42*a* is formed where the single external connection terminal 31 are formed.

The guiding projection portions 43 and the circulatory projection portions 44 are formed on the inner surface (rear surface) of the cover portion 42 and protrude toward the storage area 40*a*. The guiding projection portions 43 are formed away from the side wall portions 41*a* to 41*d* in plan view. In FIGS. 1 and 2, the guiding projection portions 43 each have a columnar shape. The guiding projection portions 43 may each have a cylindrical shape or a prismatic shape. The guiding projection portions 43 are formed to sandwich the terminal opening 42*a* and are disposed linearly along the side wall portions 41*b* and 41*d* in plan view. The guiding projection portions 43 each have a projecting end portion (an end portion in the −Z direction in FIG. 1) that is into contact with the sealing material 36. It is preferable that the guiding projection portions 43 have the largest possible diameter. As will be described below, the guiding projection portions 43 guide rising of the sealing material 36. If the individual guiding projection portion 43 has a larger surface area, more sealing material 36 rises on the guiding projection portion 43. The individual guiding projection portion 43 may each have a larger diameter than that of the individual circulatory projection portion 44 to be described below.

In FIGS. 1 and 2, the circulatory projection portions 44 each have a columnar shape. The circulatory projection portions 44 may each have a cylindrical shape or a prismatic shape, too. The circulatory projection portions 44 are formed to sandwich the terminal opening 42*a* in side view, and each circulatory projection portion 44 is formed between the terminal opening 42*a* and a guiding projection portion 43. The circulatory projection portions 44 each have a projecting end portion (an end portion in the −Z direction in FIG. 1) that protrudes toward the storage area 40*a* without being into contact with the sealing material 36.

The guiding projection portions 43 and the circulatory projection portions 44 in FIGS. 1 and 2 vertically extend from the inner surface of the cover portion 42 toward the storage area 40*a*. As long as the projecting end portions of the guiding projection portions 43 are into contact with the sealing material 36, the guiding projection portions 43 and the circulatory projection portions 44 may extend diagonally from the inner surface of the cover portion 42 within about ±45° with respect to the −Z direction. In this case, the guiding projection portions 43 and the circulatory projection portions 44 may each extend diagonally in a different direction. The guiding projection portions 43 and the circulatory projection portions 44 may be arranged in any way as long as the guiding projection portions 43 and the circulatory projection portions 44 are arranged in a line with the terminal opening 42*a* located as the center. For example, the guiding projection portions 43 and the circulatory projection portions 44 may be disposed along the side wall portions 41*a* and 41*c*. In addition, the guiding projection portions 43 and the circulatory projection portions 44 may be arranged diagonally with respect to the ±Y directions (or the +X directions).

The case 40 as described above is made of resin. This resin contains thermoplastic resin as its main component. Examples of the thermoplastic resin include polyphenylene sulfide resin, polybutylene terephthalate resin, polybutylene succinate resin, polyamide resin, and acrylonitrile butadiene styrene resin. Filler may be added to this resin. Examples of the filler include glass, silicon oxide, aluminum oxide, silicon nitride, and boron nitride. The case 40 is formed by filling a predetermined mold with the above-described resin, curing the resin, and removing the mold. The side wall portions 41*a* to 41*d* and the cover portion 42 may be formed by integral molding. Alternatively, the side wall portions 41*a* to 41*d* and the cover portion 42 may be formed separately. In this case, the cover portion 42 is bonded to the top portion of each of the side wall portions 41*a* to 41*d* via adhesive.

The cover portion 42, the guiding projection portions 43, and the circulatory projection portions 44 may be formed by integral molding. Alternatively, the cover portion 42, the guiding projection portions 43, and the circulatory projection portions 44 may be formed separately. The guiding projection portions 43 and the circulatory projection portions 44 may be inserted into openings formed in predetermined locations of the separately formed cover portion 42. Alternatively, the guiding projection portions 43 and the circulatory projection portions 44 may be attached to the separately formed cover portion 42 via bonding material. The cover portion 42, the guiding projection portions 43, and the circulatory projection portions 44 may be made of different material.

The case 40 is filled with the sealing material 36 up to a height such that at least the insulating circuit board 20, the semiconductor chips 30, and the bonding wires 25 are sealed. In addition, the case 40 is filled with the sealing material 36 up to a height such that the sealing material 36 does not come into contact with the inner surface (the rear surface) of the cover portion 42. That is, there is a gap between the inner surface (the rear surface) of the cover portion 42 and the sealing material 36. This gap may be between 5% and 100%, inclusive, of the filling height of the sealing material 36. Preferably, the gap is between 10% and 50%, inclusive, of the filling height. If the gap is too small, when the sealing material 36 thermally expands, the sealing material 36 could push up the cover portion 42, and as a result, the semiconductor device 1 could be damaged. If the gap is too large, the semiconductor device 1 could become too thick and could not be stored in a predetermined space in electrical equipment. The sealing material 36 contains silicone gel as its main component. The silicone gel contains liquid low-molecular siloxane. The low-molecular siloxane is between 20% and 30%, inclusive, of the silicone gel. The liquid low-molecular siloxane is entangled in a chain structure, and the gaps of the polymeric siloxane are filled with the liquid low-molecular siloxane. The liquid low-molecular siloxane functions as a buffer for the thermal stress caused by temperature change. Thus, even when the temperature of the sealing material 36 changes, the liquid low-molecular siloxane is able to maintain the insulating function.

A cooling unit may be attached to the rear surface of the semiconductor device 1 (the heat dissipation plate 35) via bonding material. Examples of this bonding material include solder, brazing material, and metal sintered material. The bonding material may be thermal interface material. The thermal interface material is adhesive, including an elastomer sheet, room temperature vulcanization (RTV) rubber, gel, or phase change material, for example. By attaching a cooling unit to the rear surface of the semiconductor device 1 via such brazing material or thermal interface material, the heat dissipation of the semiconductor device 1 is improved.

For example, the cooling unit is a heatsink or a cooling device that performs cooling with refrigerant. Regarding the heatsink, a plurality of fins may be attached directly to the rear surface of the heat dissipation plate 35. As is the case with the heat dissipation plate 35, the heatsink is also made of metal material having excellent thermal conductivity as its main component. The metal material is, for example, copper, aluminum, or an alloy containing at least one of these kinds.

Figure 3:
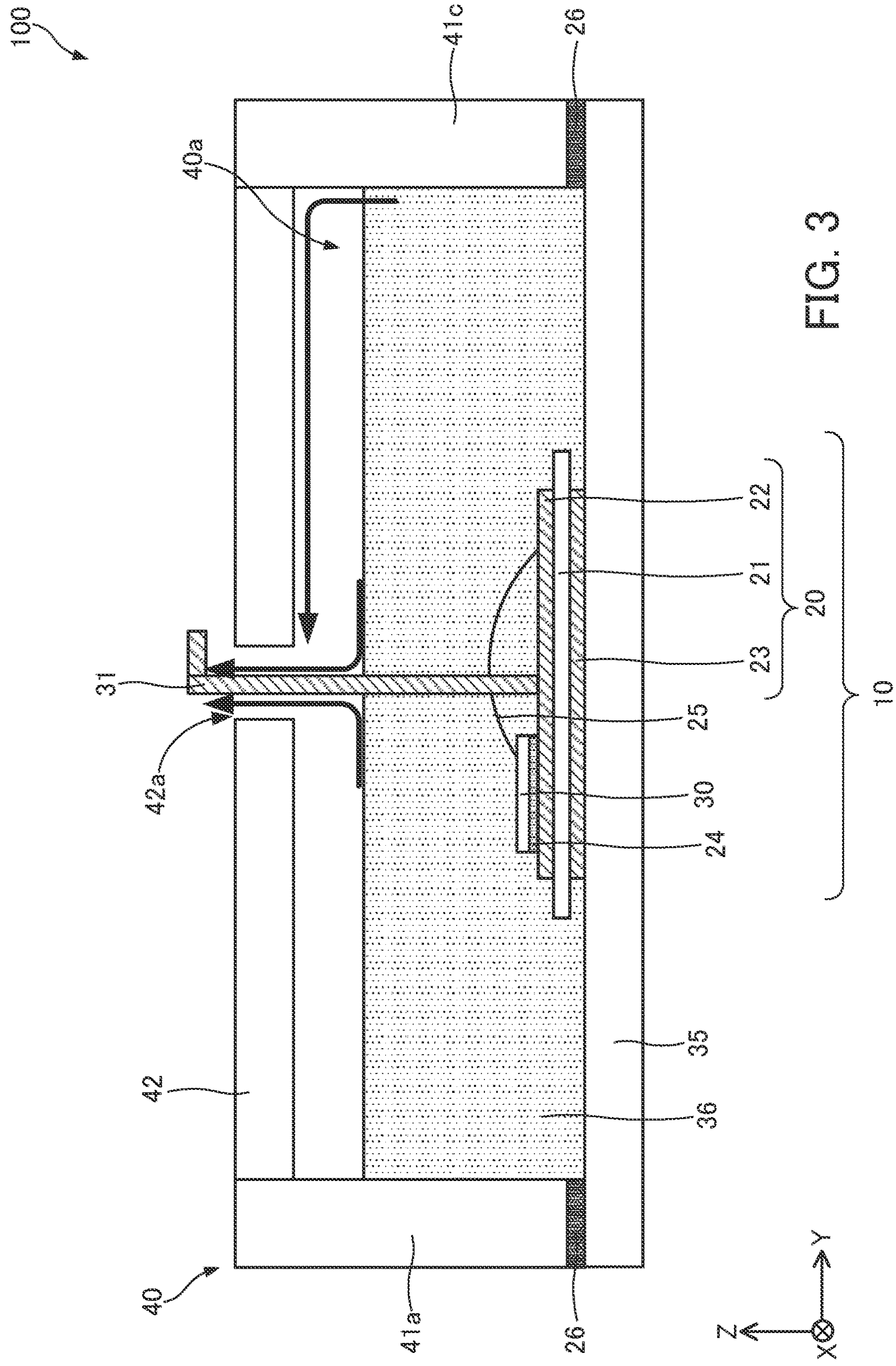
FIG. 3 illustrates rising of sealing material in a semiconductor device according to a reference example.

Next, a semiconductor device that does not include the guiding projection portions 43 and the circulatory projection portions 44 will be described as a reference example of the semiconductor device 1 with reference to FIG. 3. FIG. 3 illustrates rising of sealing material in a semiconductor device according to a reference example. This semiconductor device 100 illustrated in FIG. 3 and the above semiconductor device 1 have the same structure, expect that the semiconductor device 100 does not include the guiding projection portions 43 and the circulatory projection portions 44 of the semiconductor device 1.

As described above, the sealing material 36 of the semiconductor device 100 is silicone gel containing liquid low-molecular siloxane. Of all the liquid low-molecular siloxane in the silicone gel, the liquid low-molecular siloxane that is not entangled in a chain structure could seep on the surface of the silicone gel. The seeped liquid low-molecular siloxane could rise on components in the storage area 40*a*. For example, the liquid low-molecular siloxane rises upward (+Z direction) on the inner walls of the side wall portions 41*a* to 41*d* (for example, the side wall portion 41*c* in FIG. 3) of the case 40. The liquid low-molecular siloxane rises on the side wall portion 41*c* of the case 40, flows on the rear surface of the cover portion 42, and reaches the terminal opening 42*a*. The liquid low-molecular siloxane consequently seeps from the terminal opening 42*a* to the outside. In addition, the liquid low-molecular siloxane rises upward (+Z direction) on the external connection terminal 31 and seeps from the terminal opening 42*a* to the outside.

The liquid low-molecular siloxane that has seeped from the terminal opening 42*a* to the outside of the semiconductor device 100 as described above could soil the surroundings and a person handling the semiconductor device 100. The amount of the seeped liquid low-molecular siloxane is about 1 wt % of the total amount of the silicone gel. Thus, this amount does not affect deterioration in the insulating property of the semiconductor device 100.

Figure 4:
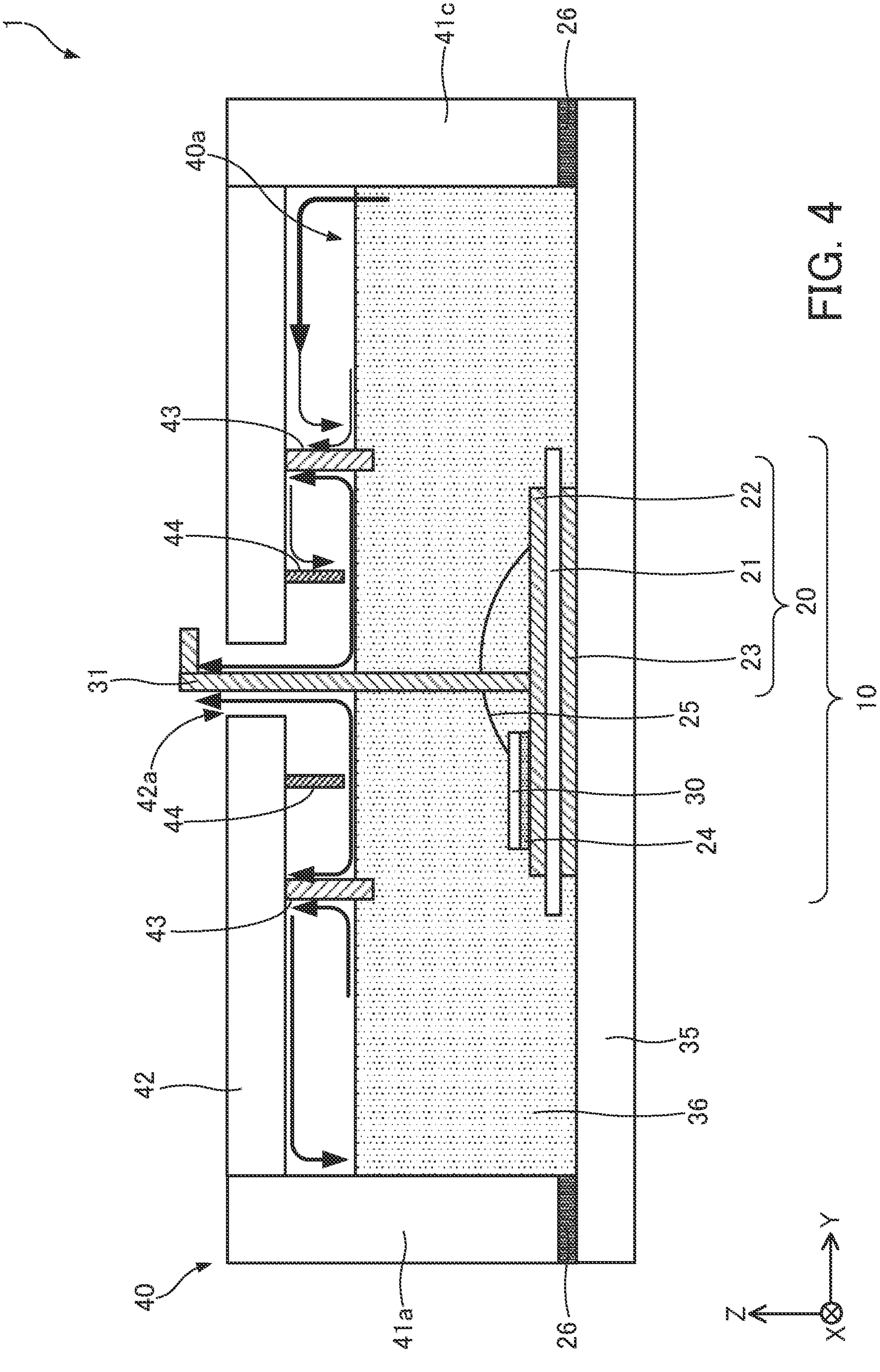
FIG. 4 illustrates rising of sealing material in the semiconductor device according to the first embodiment.

Next, seeping of liquid low-molecular siloxane from the semiconductor device 1 including the guiding projection portions 43 and the circulatory projection portions 44 will be described with reference to FIG. 4. FIG. 4 illustrates rising of the sealing material in the semiconductor device according to the first embodiment.

As in the case with FIG. 3, the liquid low-molecular siloxane (the sealing material 36) rises on components of the semiconductor device 1 in the +Z direction. The semiconductor device 1 includes the guiding projection portions 43 as its components, in addition to the side wall portions 41*a* to 41*d* and the external connection terminal 31. Each of the guiding projection portions 43 has one end that is into contact with the inner surface (rear surface) of the cover portion 42 and extends from the cover portion 42 toward the sealing material 36. Each of the guiding projection portions 43 has the other end (projecting end portion) that is into contact with the sealing material 36. Thus, the sealing material 36 rises upward (+Z direction) on the guiding projection portions 43. Preferably, the projecting end portions of the guiding projection portions 43 are embedded into the sealing material 36. It is preferable that the projecting end portions of the guiding projection portions 43 be located below the sealing surface, that is, the upper surface of the sealing material 36, by 1 mm or more and 10 mm or less. If the projecting end portions are embedded too shallowly, the sealing material 36 could not rise on the guiding projection portions 43. If the projecting end portions are embedded too deeply, the sealing material 36 could come into contact with components of the semiconductor module 10 and cause damage thereto. In the semiconductor device 1, the sealing material 36 rises not only on the side wall portions 41*a* to 41*d* and the external connection terminal 31 but also on the guiding projection portions 43. Thus, less sealing material 36 rises on the side wall portions 41*a* to 41*d* and the external connection terminal 31. That is, the sealing material 36 illustrated in FIG. 4 needs more time to rise on the side wall portions 41*a* to 41*d* and the external connection terminal 31 than the sealing material 36 illustrated in FIG. 3. Thus, it takes more time for the sealing material 36 to reach the terminal opening 42*a*. In addition, since less sealing material 36 rises, even when the sealing material 36 reaches the terminal opening 42*a*, less sealing material 36 seeps from the terminal opening 42*a*. To further delay the time when the sealing material 36 reaches the terminal opening 42*a* and reduce the amount of sealing material 36 that seeps from the terminal opening 42*a*, the number of guiding projection portions 43 may be increased or the surface area of the individual guiding projection portion 43 may be increased.

The semiconductor device 1 may also include the circulatory projection portions 44. Some of the sealing material 36 that has risen on the side wall portions 41*a* to 41*d* and the guiding projection portions 43 flows toward the terminal opening 42*a* on the inner surface of the cover portion 42. If there is a circulatory projection portion 44 on the way to the terminal opening 42*a*, the sealing material 36 is trapped by the circulatory projection portion 44. In addition, some of the sealing material 36 that has risen on the side wall portions 41*a* to 41*d* and the guiding projection portions 43 is returned to the storage area 40*a* by the circulatory projection portions 44. The amount of sealing material 36 flowing toward the terminal opening 42*a* on the inner surface of the cover portion 42 is further reduced by the circulatory projection portions 44, and the time when the sealing material 36 reaches the terminal opening 42*a* is delayed. Each of these circulatory projection portions 44 has one end that is into contact with the inner surface (rear surface) of the cover portion 42 and extends from the cover portion 42 toward the sealing material 36. Each of the circulatory projection portions 44 has the other end (projecting end portion) that is not into contact with the sealing material 36. Preferably, the projecting end portions of the circulatory projection portions 44 are away from the sealing material 36 by an appropriate distance. It is preferable that the projecting end portions of the circulatory projection portions 44 be located above the sealing surface, that is, the upper surface of the sealing material 36 by 1 mm or more and 10 mm or less. If the distance is too short, when the sealing material 36 thermally expands, the circulatory projection portions 44 could come into contact with the sealing material 36. If the distance is too long, the circulatory projection portions 44 fail to sufficiently trap the sealing material 36 or return the sealing material 36 to the storage area. Since less sealing material 36 rises in the semiconductor device 1, even when the sealing material 36 reaches the terminal opening 42*a*, less sealing material 36 seeps from the terminal opening 42*a*.

Some of the sealing material 36 that has risen on the guiding projection portions 43 flows in directions (for example, in the directions of the side wall portions 41*a* to 41*d*) different from the direction of the terminal opening 42*a*. When such sealing material 36 that does not flow toward the terminal opening 42*a* reaches the side wall portions 41*a* to 41*d* via the cover portion 42, the sealing material 36 is returned to the sealing material 36 in the storage area 40*a* via the side wall portions 41*a* to 41*d*. Similarly, some of the sealing material 36 that has risen on the side wall portions 41*a* to 41*d* is returned to the sealing material 36 in the storage area 40*a* via the guiding projection portions 43.

In addition, there are cases in which beams are formed on the inner surface of the cover portion 42 of the case 40. The beams are formed in a grid pattern, for example. In this way, the case 40 is able to maintain certain strength or have improved strength. While the guiding projection portions 43 and the circulatory projection portions 44 have different functions from the function of the beams, the guiding projection portions 43 and the circulatory projection portions 44 may also function as the beams. However, unlike the beams, the guiding projection portions 43 and the circulatory projection portions 44 are not into contact with the side wall portions 41*a* to 41*d*. If the guiding projection portions 43 and the circulatory projection portions 44 are into contact with the side wall portions 41*a* to 41*d*, the guiding projection portions 43 and the circulatory projection portions 44 substantially merge with the side wall portions 41*a* to 41*d*, and consequently, the guiding projection portions 43 and the circulatory projection portions 44 are unable to sufficiently provide their advantageous effects as described above. The guiding projection portions 43 and the circulatory projection portions 44 are formed away from the side wall portions 41*a* to 41*d* in plan view.

The above semiconductor device 1 includes the semiconductor module 10 and the heat dissipation plate 35 having a front surface on which the semiconductor module 10 is disposed. In addition, the semiconductor device 1 includes the case 40 which includes the side wall portions 41*a* to 41*d* that are disposed on the front surface of the heat dissipation plate 35 and that surround, with the heat dissipation plate 35, the storage area 40*a* including the semiconductor module 10 and which includes the cover portion 42 that is disposed on the side wall portions 41*a* to 41*d*, covers the storage area 40*a*, has the terminal opening 42*a*, and has an inner surface on which the guiding projection portions 43 protruding toward the storage area 40*a* are formed. The semiconductor device 1 includes the sealing material 36 with which the storage area 40*a* is filled and which seals the semiconductor module 10. The guiding projection portions 43 of the semiconductor device 1 each have a projecting end portion that is into contact with the sealing material 36. Since the sealing material 36 rises on these guiding projection portions 43, less sealing material 36 rises on the side wall portions 41*a* to 41*d*. Since less sealing material 36 rises on the individual component, the sealing material 36 needs more time to rise on the side wall portions 41*a* to 41*d*. Thus, it also takes more time for the sealing material 36 to reach the terminal opening 42*a*. In addition, since less sealing material 36 rises on the individual component, even when the sealing material 36 reaches the terminal opening 42*a*, less sealing material 36 seeps from the terminal opening 42*a*. As a result, since more time is needed for the sealing material 36 to seep from the terminal opening 42*a* and less sealing material 36 seeps from the terminal opening 42*a*, deterioration in the handleability of the semiconductor device 1 is prevented.

Hereinafter, various modes of the guiding projection portions 43 and the circulatory projection portions 44 formed on the inner surface of the cover portion 42 of the semiconductor device 1 will be described as variations. In the following plan views of the cover portion 42 according to the variations to be described below, the guiding projection portions 43 and the circulatory projection portions 44 are hatched differently to distinguish the guiding projection portions 43 and the circulatory projection portions 44 from each other.

(Variation 1-1)

Figure 5:
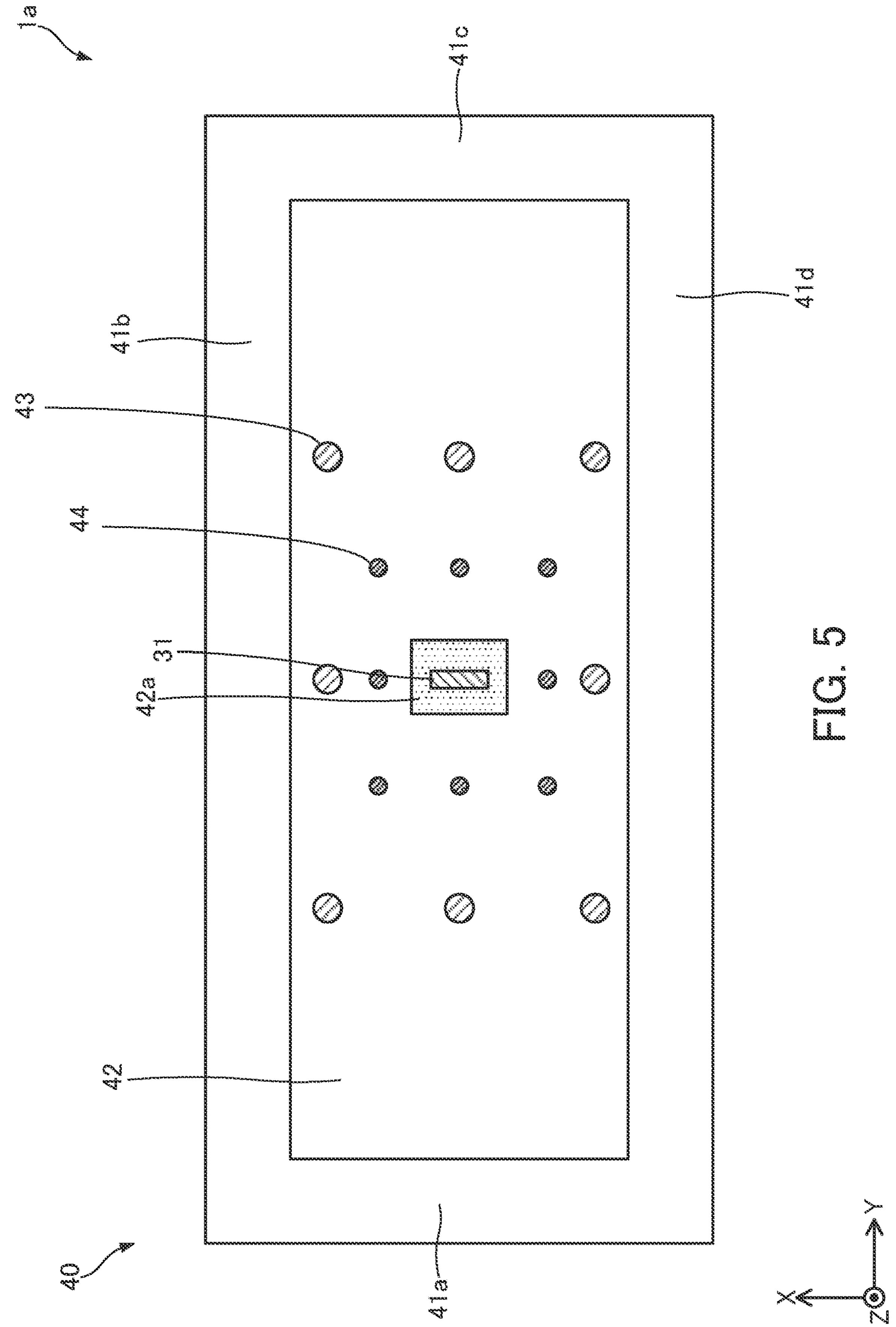
FIG. 5 is a plan view of a semiconductor device according to variation 1-1 of the first embodiment.

A semiconductor device 1*a* according to variation 1-1 will be described with reference to FIG. 5. FIG. 5 is a plan view of the semiconductor device 1*a* according to variation 1-1 of the first embodiment. Eight guiding projection portions 43 and eight circulatory projection portions 44 are formed on the inner surface of the cover portion 42 in FIG. 5.

The guiding projection portions 43 are formed on the inner surface of the cover portion 42 and are symmetric with respect to the terminal opening 42*a*. Three guiding projection portions 43 are arranged along each of the side wall portions 41*a* to 41*d*.

The circulatory projection portions 44 are formed on the inner side of the guiding projection portions 43 on the inner surface of the cover portion 42 and are symmetric with respect to the terminal opening 42*a*. Three circulatory projection portions 44 are arranged along each of the side wall portions 41*a* to 41*d*. In addition, each of the circulatory projection portions 44 is formed on a line connecting a guiding projection portion 43 and the terminal opening 42*a*.

The guiding projection portions 43 and the circulatory projection portions 44 are formed not only in the longitudinal direction (±Y directions) of the semiconductor device 1*a* but also in the traverse direction (±X directions) of the semiconductor device 1*a*. Compared with the semiconductor device 1, the semiconductor device 1*a* includes more guiding projection portions 43. Thus, since the sealing material 36 rises on more areas, less sealing material 36 rises on the individual component. In addition, compared with the semiconductor device 1, the semiconductor device 1*a* includes more circulatory projection portions 44. Thus, more sealing material 36 is returned to the storage area 40*a*. Therefore, the time when the sealing material 36 reaches the terminal opening 42*a* is further delayed. In addition, less sealing material 36 seeps from the terminal opening 42*a*, and more time is needed for the sealing material 36 to seep from the terminal opening 42*a*. Compared with the semiconductor device 1, deterioration in the handleability of the semiconductor device 1*a* is further prevented.

(Variation 1-2)

Figure 6:
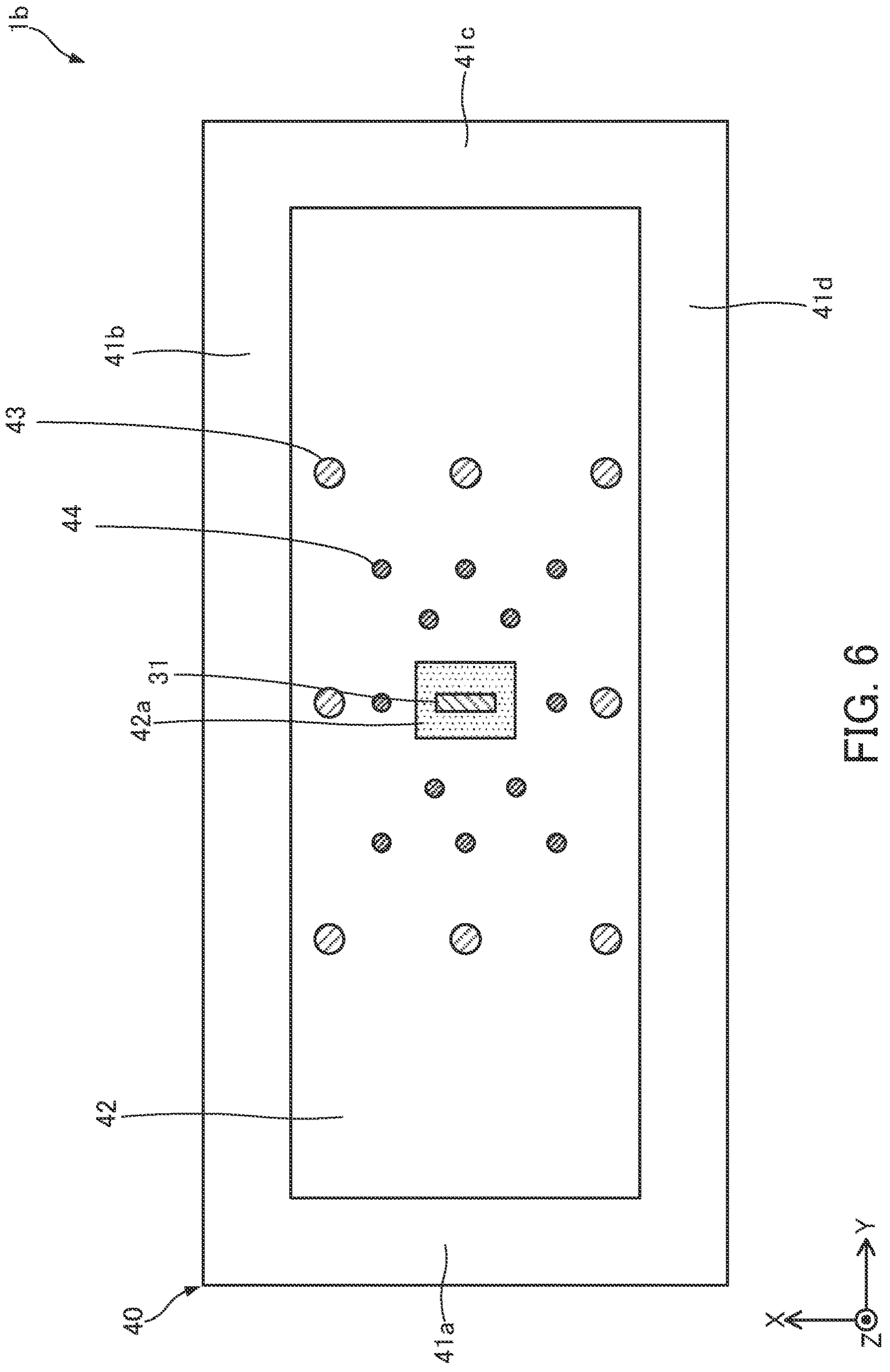
FIG. 6 is a plan view of a semiconductor device according to variation 1-2 of the first embodiment.

A semiconductor device 1*b* according to variation 1-2 will be described with reference to FIG. 6. FIG. 6 is a plan view of the semiconductor device 1*b* according to variation 1-2 of the first embodiment. Eight guiding projection portions 43 and 12 projection portions 44 are formed on the inner surface of the cover portion 42 in FIG. 6.

The guiding projection portions 43 are formed at the same locations as in variation 1-1 on the inner surface of the cover portion 42. In addition to the circulatory projection portions 44 that are formed at the same locations as in variation 1-1 on the inner surface of the cover portion 42, two more circulatory projection portions 44 are formed along the side wall portion 41*a* and two more circulatory projection portions 44 are formed along the side wall portion 41*c*. The individual circulatory projection portion 44 is formed on a line connecting a guiding projection portion 43 and the terminal opening 42*a*.

Compared with the semiconductor device 1*a*, the semiconductor device 1*b* includes additional circulatory projection portions 44 in an area near the terminal opening 42*a*. Compared with the semiconductor device 1*a*, the semiconductor device 1*b* returns more sealing material 36 on the inner surface of the cover portion 42 to the storage area 40*a*. Compared with the semiconductor device 1*a*, the semiconductor device 1*b* further reduces the amount of sealing material 36 that seeps from the terminal opening 42*a* and delays the time when the sealing material 36 seeps from the terminal opening 42*a*.

(Variation 1-3)

Figure 7:
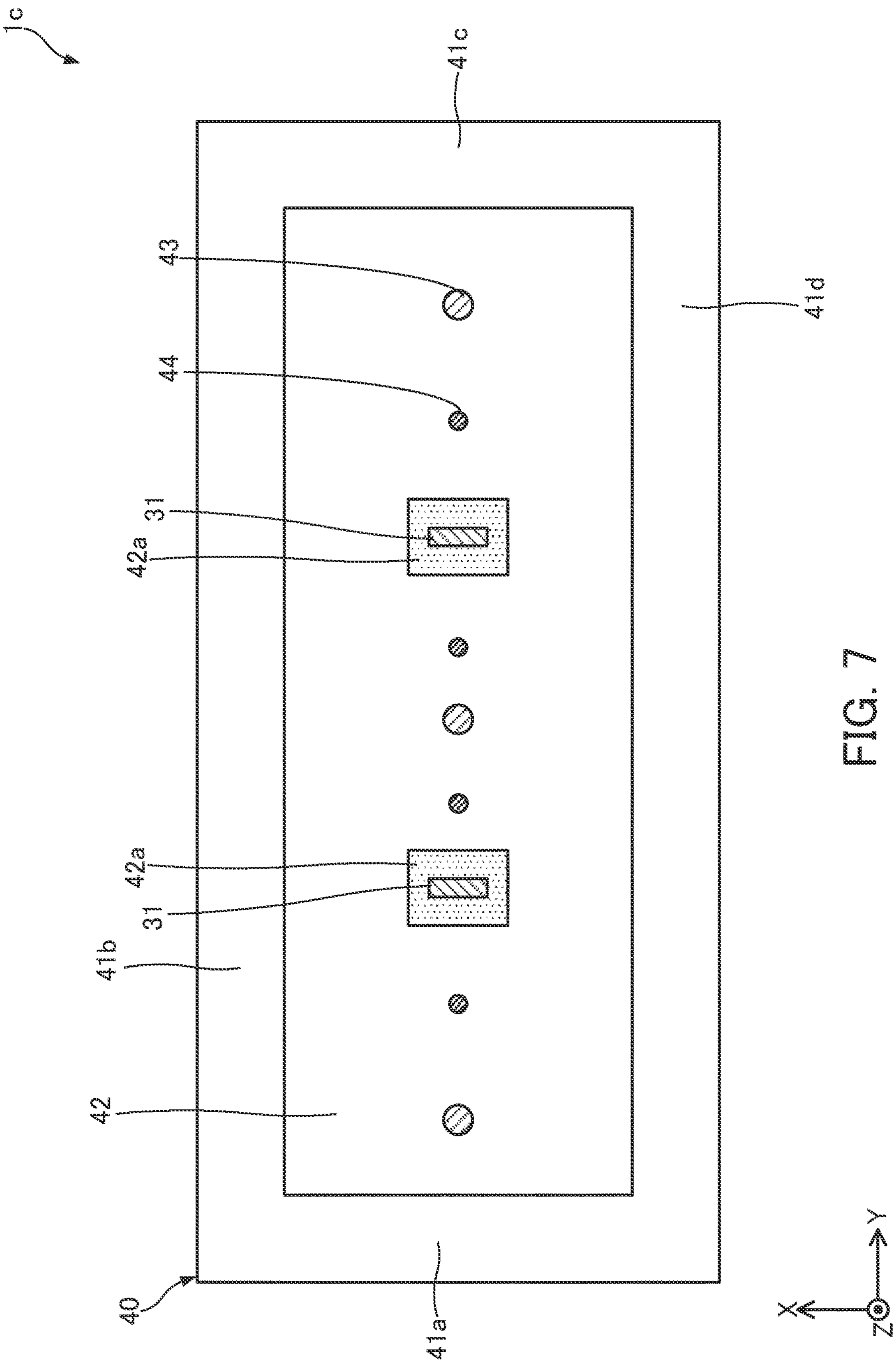
FIG. 7 is a plan view of a semiconductor device according to variation 1-3 of the first embodiment.

A semiconductor device 1*c* according to variation 1-3 will be described with reference to FIG. 7. The semiconductor device 1*c* includes two terminal openings 42*a*. FIG. 7 is a plan view of the semiconductor device 1*c* according to variation 1-3 of the first embodiment. In FIG. 7, three guiding projection portions 43 and four circulatory projection portions 44 are formed on the inner surface of the cover portion 42.

Two guiding projection portions 43 sandwich a terminal opening 42*a* on the inner surface of the cover portion 42 and the guiding projection portions 43 are formed linearly along the side wall portions 41*b* and 41*d*. The three guiding projection portions 43 are arranged along the side wall portions 41*b* and 41*d*. Each of the circulatory projection portions 44 is formed between a guiding projection portion 43 and a terminal opening 42*a* on the inner surface of the cover portion 42.

While the semiconductor device 1*c* includes two terminal openings 42*a* formed in the cover portion 42, the time when the sealing material 36 reaches the terminal openings 42*a* is delayed, as is the case with the semiconductor device 1. In addition, less sealing material 36 seeps from the terminal openings 42*a*, and more time is needed for the sealing material 36 to seep from the terminal openings 42*a*.

(Variation 1-4)

Figure 8:
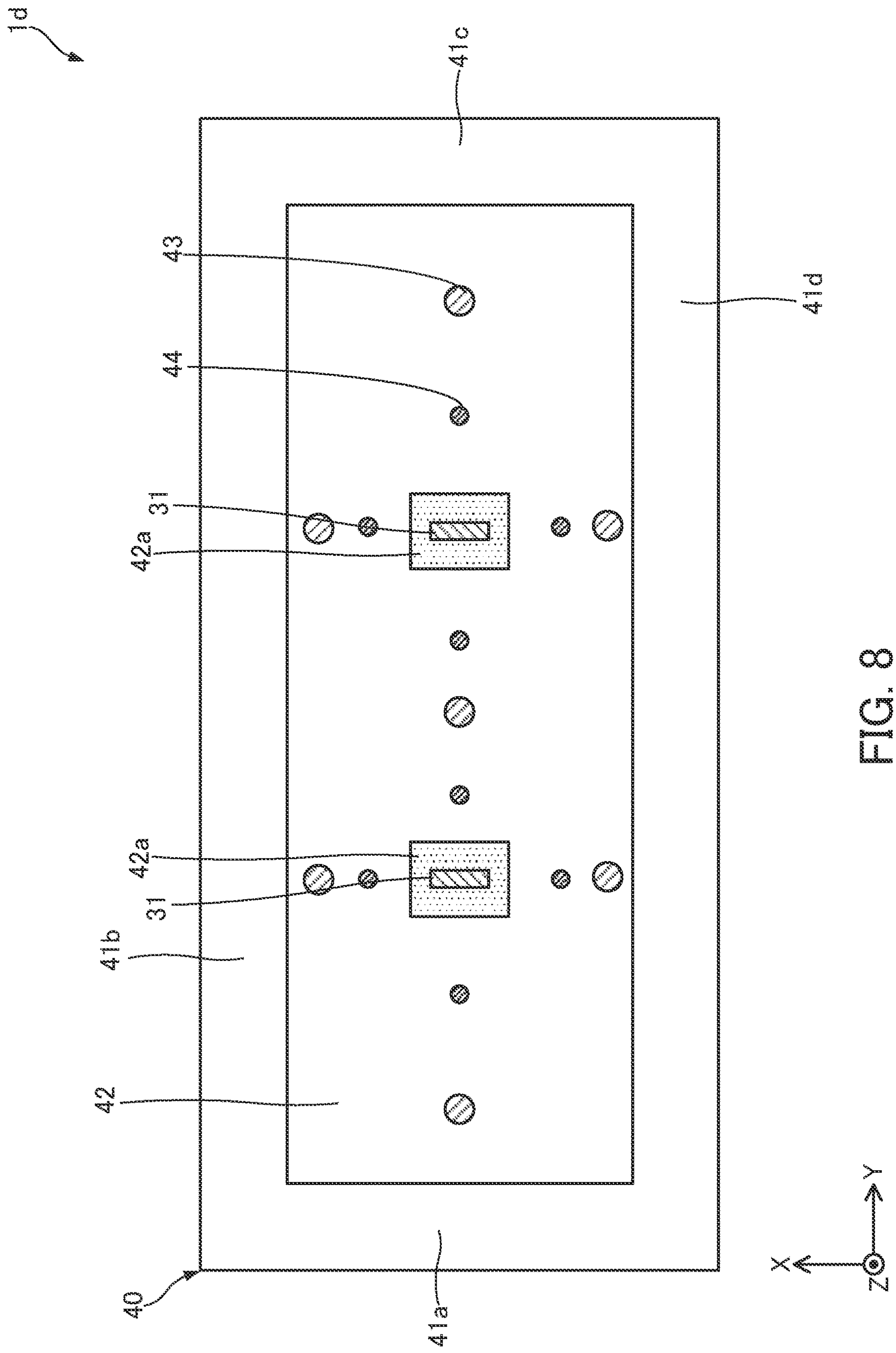
FIG. 8 is a plan view of a semiconductor device according to variation 1-4 of the first embodiment.

A semiconductor device 1*d* according to variation 1-4 will be described with reference to FIG. 8. The semiconductor device 1*d* includes more guiding projection portions 43 and more circulatory projection portions 44 around the two terminal openings 42*a*. FIG. 8 is a plan view of the semiconductor device 1*d* according to variation 1-4 of the first embodiment. In FIG. 8, seven guiding projection portions 43 and eight circulatory projection portions 44 are formed on the inner surface of the cover portion 42.

In addition to the guiding projection portions 43 formed on the inner surface of the cover portion 42 of the semiconductor device 1*c*, a guiding projection portion 43 is formed between an individual terminal opening 42*a* and the side wall portion 41*b* and another guiding projection portion 43 is formed between the individual terminal opening 42*a* and the side wall portion 41*d*. A circulatory projection portion 44 is formed on the inner surface of the cover portion 42 between an individual guiding projection portion 43 and an individual terminal opening 42*a*.

Compared with the semiconductor device 1*c*, the semiconductor device 1*d* includes more guiding projection portions 43 and more circulatory projection portions 44. Compared with the semiconductor device 1*c*, the semiconductor device 1*d* further delays the time when the sealing material 36 reaches the terminal openings 42*a*. In addition, less sealing material 36 seeps from the terminal openings 42*a*, and more time is needed for the sealing material 36 to seep from the terminal openings 42*a*.

(Variation 1-5)

Figure 9:
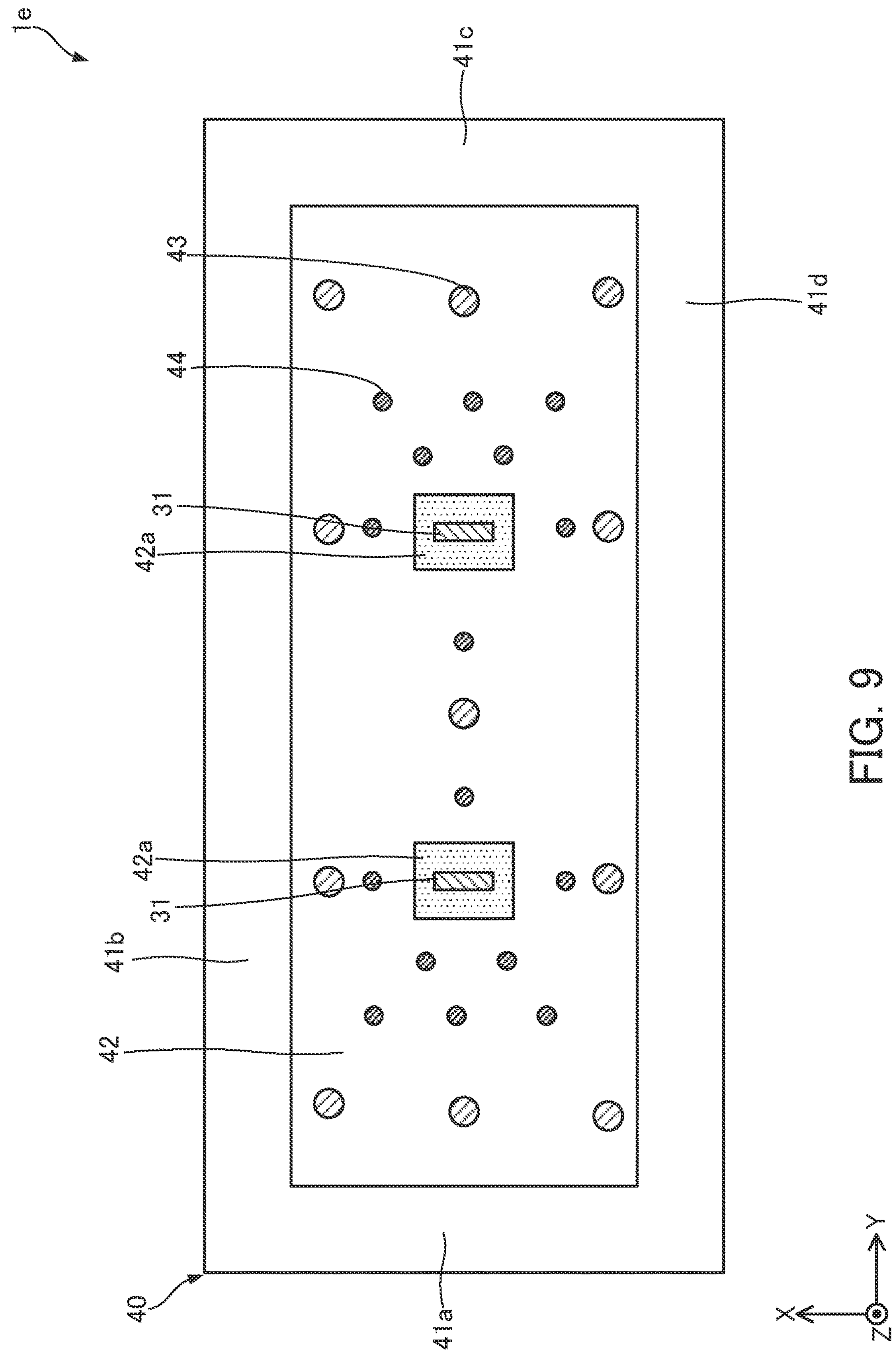
FIG. 9 is a plan view of a semiconductor device according to variation 1-5 of the first embodiment.

A semiconductor device 1*e* according to variation 1-5 will be described with reference to FIG. 9. Compared with the semiconductor device 1*d*, the semiconductor device 1*e* includes more guiding projection portions 43 and more circulatory projection portions 44. FIG. 9 is a plan view of the semiconductor device 1*e* according to variation 1-5 of the first embodiment. In FIG. 9, 11 guiding projection portions 43 and 16 circulatory projection portions 44 are formed on the inner surface of the cover portion 42.

While the semiconductor device 1*d* includes two guiding projection portions 43 along each of the side wall portions 41*b* and 41*d* on the inner surface of the cover portion 42, the semiconductor device 1*e* further includes a guiding projection portion 43 outside each pair of guiding projection portions 43 (near the side wall portions 41*a* and 41*c*).

In addition to the circulatory projection portions 44 that are formed on the inner surface of the cover portion 42 of the semiconductor device 1*d*, the semiconductor device 1*e* includes two more circulatory projection portions 44 near one terminal opening 42*a* in the direction of the side wall portion 41*a*, the two circulatory projection portions 44 being lined along the side wall portion 41*a*, and includes two more circulatory projection portions 44 near the other terminal opening 42*a* in the direction of the side wall portion 41*c*, the two circulatory projection portions 44 being lined along the side wall portion 41*c*. In addition, while the semiconductor device 1*d* includes an outermost circulatory projection portion 44 along each of the side wall portions 41*a* and 41*c*, the semiconductor device 1*e* further includes a circulatory projection portion 44 between one outermost circulatory projection portion 44 and the side wall portion 41*b* and includes another circulatory projection portion 44 between this outermost circulatory projection portion 44 and the side wall portion 41*d*. In addition, the semiconductor device 1*e* further includes another circulatory projection the other outermost circulatory portion 44 between projection portion 44 and the side wall portion 41*b* and includes another circulatory projection portion 44 between this outermost circulatory projection portion 44 and the side wall portion 41*d*. The individual circulatory projection portion 44 is formed on a line connecting a guiding projection portion 43 and a terminal opening 42*a*.

Compared with the semiconductor device 1*d*, the semiconductor device 1*e* includes more guiding projection portions 43 and more circulatory projection portions 44. In addition, compared with the semiconductor device 1*d*, the semiconductor device 1*e* further reduces the amount of sealing material 36 that rises on the individual component and returns more sealing material 36 that has reached the inner surface of the cover portion 42 to the storage area 40*a*. Compared with the semiconductor device 1*d*, the semiconductor device 1*e* further reduces the amount of sealing material 36 that seeps from the terminal openings 42*a* and delays the time when the sealing material 36 seeps from the terminal openings 42*a*.

(Variation 1-6)

Figure 10:
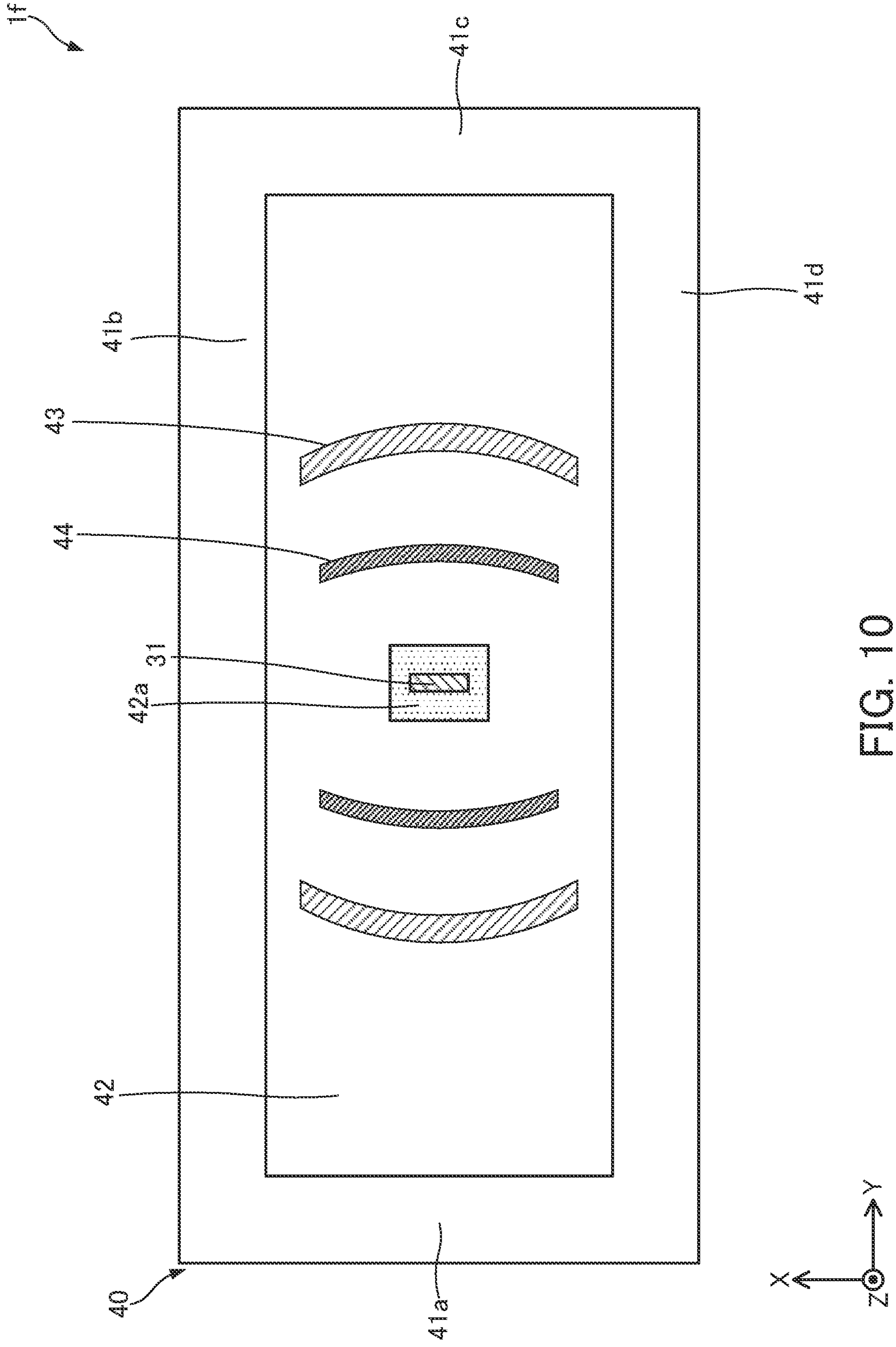
FIG. 10 is a plan view of a semiconductor device according to variation 1-6 of the first embodiment.

A semiconductor device 1*f* according to variation 1-6 will be described with reference to FIG. 10. The semiconductor device 1*f* includes guiding projection portions 43 and circulatory projection portions 44 each having a plate shape (an arched shape in FIG. 10) in plan view. FIG. 10 is a plan view of the semiconductor device 1*f* according to variation 1-6 of the first embodiment.

While the semiconductor device 1*f* includes two guiding projection portions 43 and two circulatory projection portions 44 as is the case with the semiconductor device 1, the guiding projection portions 43 and the circulatory projection portions 44 of the semiconductor device 1*f* each have an arched shape in plan view. In this case, too, the projecting end portions of the guiding projection portions 43 are of course into contact with the sealing material 36, and the circulatory projection portions 44 protrude toward the sealing material 36 without being into contact with the sealing material 36.

The guiding projection portions 43 and the circulatory projection portions 44 are each warped to the outside in a convex shape, assuming that the terminal opening 42*a* corresponds to the inside. These guiding projection portions 43 and circulatory projection portions 44 each have a larger surface area than those of the semiconductor device 1. In addition, the guiding projection portions 43 and the circulatory projection portions 44 cover the terminal opening 42*a* more widely. Thus, compared with the semiconductor device 1, more sealing material 36 rises on the guiding projection portions 43 of the semiconductor device 1*f*. Therefore, less sealing material 36 rises on the side wall portions 41*a* to 41*d*. The semiconductor device 1*f* includes the circulatory projection portions 44, each of which is formed between one guiding projection portion 43 and the terminal opening 42*a*. Most of the sealing material 36 that rises on the side wall portions 41$a$ to 41$d$ and the guiding projection portions 43 and that flows to the terminal opening 42$a$ are returned to the storage area 40$a$ by the circulatory projection portions 44. Thus, compared with the semiconductor device 1, the semiconductor device 1$f$ further reduces the amount of sealing material 36 that flows to the terminal opening 42$a$ and delays the time when the sealing material 36 reaches the terminal opening 42$a$. Thus, less sealing material 36 seeps from the terminal opening 42$a$, and more time is needed for the sealing material 36 to seep from the terminal opening 42$a$.

(Variation 1-7)

Figure 11:
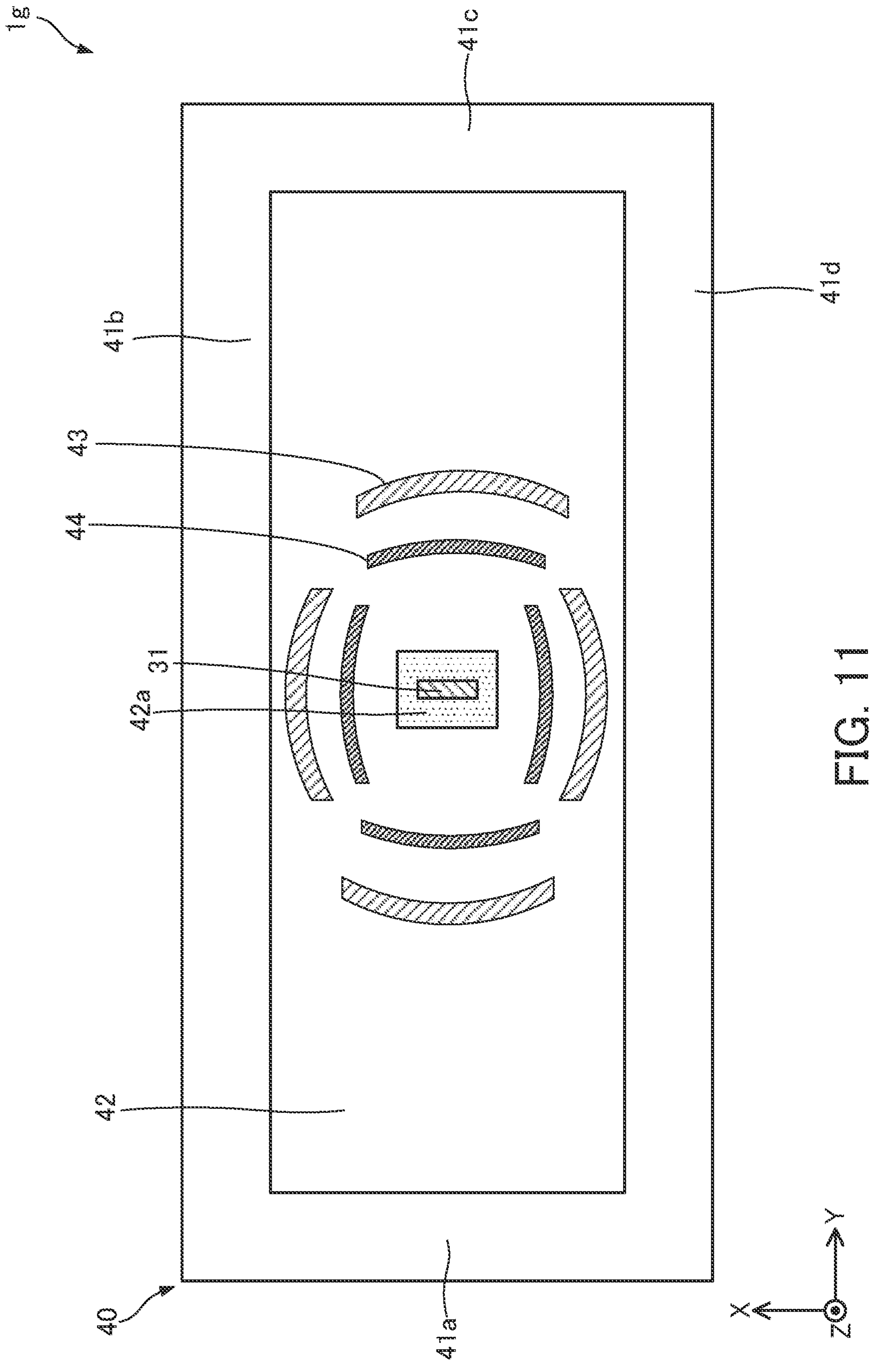
FIG. 11 is a plan view of a semiconductor device according to variation 1-7 of the first embodiment.

A semiconductor device 1$g$ according to variation 1-7 will be described with reference to FIG. 11. While, as is the case with the semiconductor device 1$f$, the semiconductor device 1$g$ includes guiding projection portions 43 and circulatory projection portions 44 each having a plate shape (an arched shape in FIG. 11) in plan view, the guiding projection portions 43 and the circulatory projection portions 44 according to variation 1-7 are arranged differently from those according to variation 1-6. FIG. 11 is a plan view of the semiconductor device 1$g$ according to variation 1-7 of the first embodiment.

In the case of the semiconductor device 1$g$, the guiding projection portions 43 and the circulatory projection portions 44 each having an arched shape in plan view are formed in four directions (each of which corresponds to one of the side wall portions 41$a$ to 41$d$) of the terminal opening 42$a$. The guiding projection portions 43 and the circulatory projection portions 44 are each warped to the outside in a convex shape, assuming that the terminal opening 42$a$ corresponds to the inside.

These guiding projection portions 43 and circulatory projection portions 44 achieve a larger surface area than those of the semiconductor device 1$f$. In addition, these guiding projection portions 43 and circulatory projection portions 44 cover the terminal opening 42$a$ more widely. Thus, compared with the semiconductor device 1$f$, the semiconductor device 1$g$ further reduces the amount of sealing material 36 that flows to the terminal opening 42$a$ and delays the time when the sealing material 36 reaches the terminal opening 42$a$. Therefore, less sealing material 36 seeps from the terminal opening 42$a$, and more time is needed for the sealing material 36 to seep the terminal opening 42$a$.

(Variation 1-8)

Figure 12:
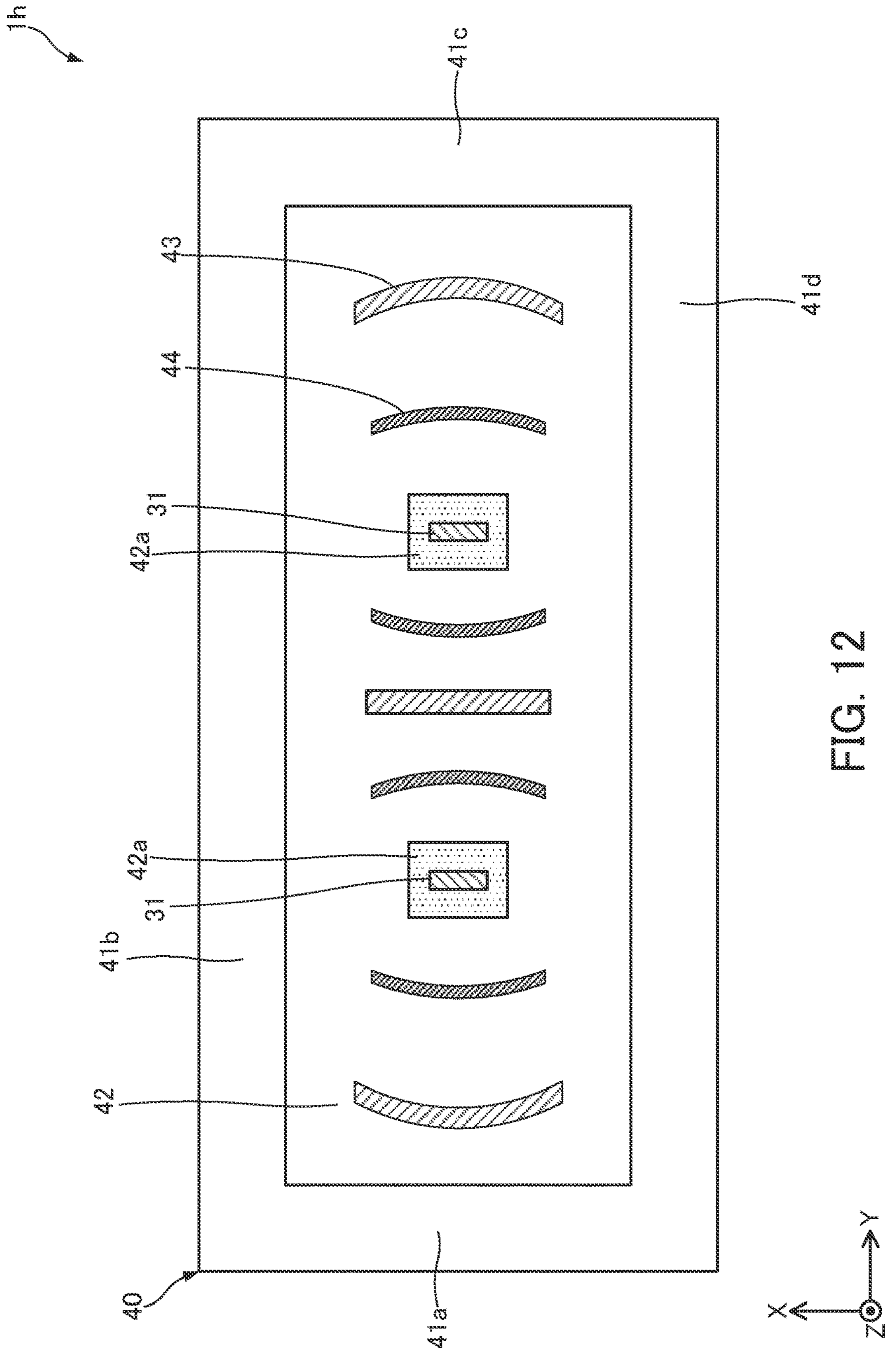
FIG. 12 is a plan view of a semiconductor device according to variation 1-8 of the first embodiment.

A semiconductor device 1$h$ according to variation 1-8 will be described with reference to FIG. 12. The semiconductor device 1$h$ includes two terminal openings 42$a$ and guiding projection portions 43 and circulatory projection portions 44 each having a plate shape (arched or straight shape) in plan view. FIG. 12 is a plan view of the semiconductor device 1$h$ according to variation 1-8 of the first embodiment.

While the guiding projection portions 43 and the circulatory projection portions 44 of the semiconductor device 1$h$ are arranged in the same way as those of the semiconductor device 1$c$, two of the guiding projection portions 43 and all the circulatory projection portions 44 of the semiconductor device 1$h$ have an arched shape in plan view, and the other guiding projection portion 43 has a straight shape in plan view. The two guiding projection portions 43 and all the circulatory projection portions 44 are each warped to the outside in a convex shape, assuming that their respective terminal openings 42$a$ correspond to the inside. The other guiding projection portion 43 sandwiched by the two terminal openings 42$a$ has a straight shape.

These guiding projection portions 43 and circulatory projection portions 44 each have a larger surface area, compared with the semiconductor device 1$c$. In addition, the guiding projection portions 43 and circulatory projection portions 44 cover the terminal openings 42$a$ more widely. Thus, compared with the semiconductor device 1$c$, more sealing material 36 rises on the guiding projection portions 43 of the semiconductor device 1$h$. Therefore, the amount of sealing material 36 that rises on the side wall portions 41$a$ to 41$d$ is further reduced. In the case of the semiconductor device 1$h$, the individual circulatory projection portion 44 is formed between a guiding projection portion 43 and a terminal opening 42$a$. Most of the sealing material 36 that rises on the side wall portions 41$a$ to 41$d$ and the guiding projection portions 43 and that flows to the terminal openings 42$a$ is returned to the storage area 40$a$ by the circulatory projection portions 44. Thus, compared with the semiconductor device 1$c$, the semiconductor device 1$h$ further reduces the amount of sealing material 36 that flows to the terminal openings 42$a$ and delays the time when the sealing material 36 reaches the terminal openings 42$a$. Therefore, less sealing material 36 seeps from the terminal openings 42$a$, and more time is needed for the sealing material 36 to seep from the terminal openings 42$a$.

(Variation 1-9)

Figure 13:
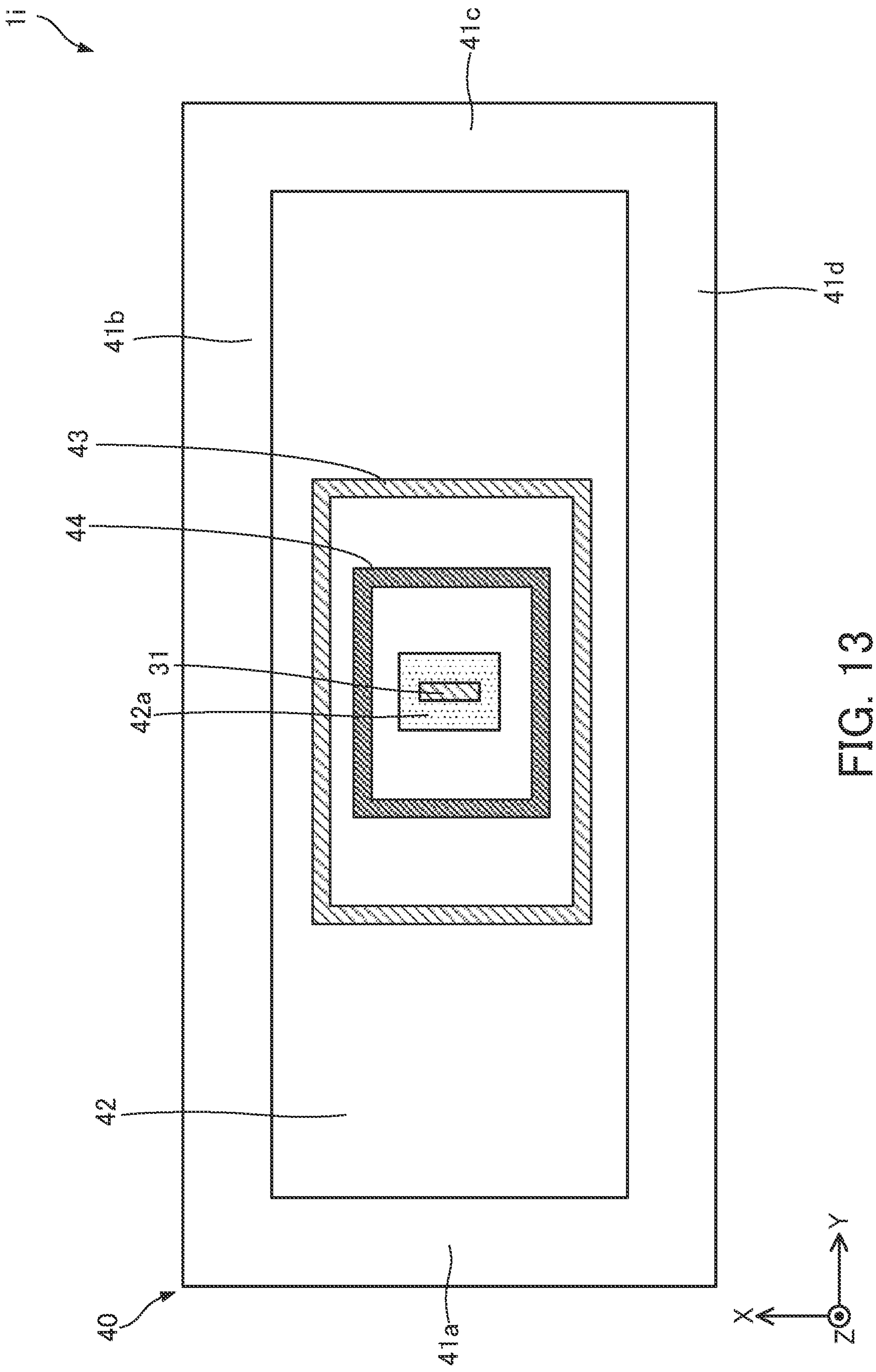
FIG. 13 is a plan view of a semiconductor device according to variation 1-9 of the first embodiment.

A semiconductor device 1$i$ according to variation 1-9 will be described with reference to FIG. 13. The semiconductor device 1$i$ includes a guiding projection portion 43 and a circulatory projection portion 44 that are formed in a continuous ring around a terminal opening 42$a$. FIG. 13 is a plan view of the semiconductor device 1$i$ according to variation 1-9 of the first embodiment.

Unlike the semiconductor device 1, the semiconductor device 1$i$ includes a guiding projection portion 43 and a circulatory projection portion 44 that are formed in a continuous ring. In this case, too, the projecting end portion of the guiding projection portion 43 is of course into contact with the sealing material 36, and the circulatory projection portion 44 protrudes toward the sealing material 36 without being into contact with the sealing material 36.

The guiding projection portion 43 surrounds the terminal opening 42$a$ and is formed in a continuous ring. As is the case with this guiding projection portion 43, the circulatory projection portion 44 surrounds the terminal opening 42$a$ and is formed in a continuous ring. The circulatory projection portion 44 is surrounded by the guiding projection portion 43. In FIG. 13, the guiding projection portion 43 and the circulatory projection portion 44 each have a rectangular shape in plan view. In this case, corners of the guiding projection portion 43 and the circulatory projection portion 44 may be rounded or chamfered. The guiding projection portion 43 and the circulatory projection portion 44, each of which is formed in a continuous ring, may have a rectangular ring shape or a circular ring shape in plan view. Any rectangular ring shape is applicable, as long as the guiding projection portion 43 and the circulatory projection portion 44 each have a substantially rectangular shape in plan view. For example, the guiding projection portion 3 and the circulatory projection portion 44 are each a rectangle, a square, a diamond, or a trapezoid in plan view. In addition, corners of the guiding projection portion 43 and the circulatory projection portion 44 may be rounded or chamfered. Examples of the circular ring shape include a circular shape and an oval shape in plan view.

The guiding projection portion 43 has a larger surface area than the guiding projection portions 43 in FIGS. 1 and 2. Less sealing material 36 rises on the side wall portions 41$a$ to 41*d*. In addition, since the guiding projection portion 43 is formed in a continuous ring, the guiding projection portion 43 returns much of the sealing material 36 that has risen on the side wall portions 41*a* to 41*d* to the storage area 40*a*, and the amount of sealing material 36 that flows to the terminal opening 42*a* is significantly reduced. Thus, more time is needed for the sealing material 36 to reach the terminal opening 42*a*. In addition, since less sealing material 36 reaches the terminal opening 42*a*, even when the sealing material 36 reaches the terminal opening 42*a*, less sealing material 36 seeps from the terminal opening 42*a*.

Since formed in a continuous ring, the circulatory projection portion 44 returns most of the sealing material 36 that flows to the terminal opening 42*a* on the cover portion 42 to the storage area 40*a*. Thus, the semiconductor device 1*i* reduces the amount of sealing material 36 that flows to the terminal opening 42*a* more reliably than any of the other semiconductor devices and delays the time when the sealing material 36 reaches the terminal opening 42*a*. Therefore, less sealing material 36 seeps from the terminal opening 42*a* and more time is needed for the sealing material 36 to seep from the terminal opening 42*a*.

(Variation 1-10)

Figure 14:
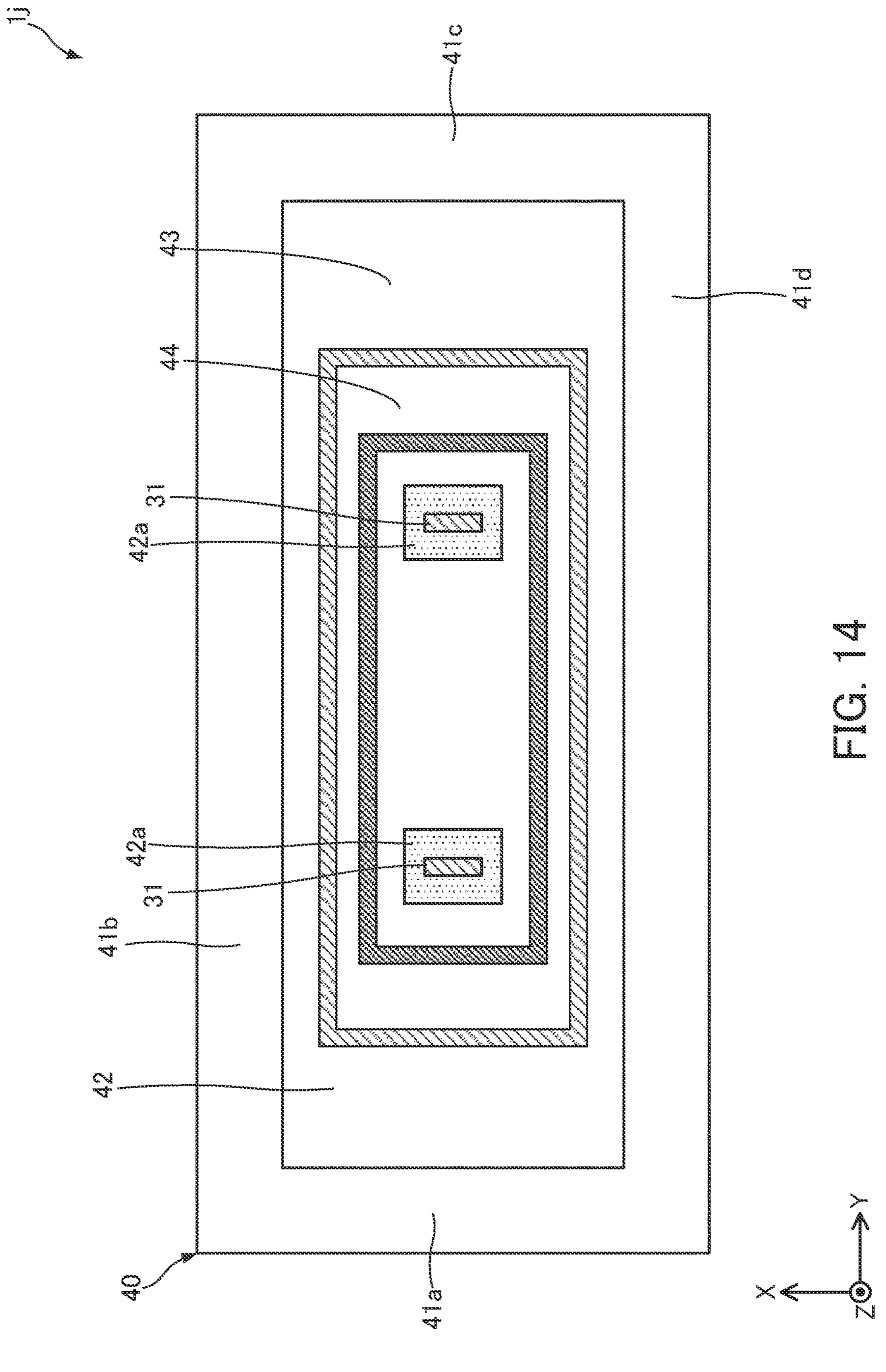
FIG. 14 is a plan view of a semiconductor device according to variation 1-10 of the first embodiment.

A semiconductor device 1*j* having two terminal openings 42*a* according to variation 1-10 will be described with reference to FIG. 14. FIG. 14 is a plan view of the semiconductor device 1*j* according to variation 1-10 of the first embodiment.

The semiconductor device 1*j* includes two terminal openings 42*a*, unlike the semiconductor device 1*i*. The semiconductor device 1*j* includes a guiding projection portion 43 and a circulatory projection portion 44, each of which is formed in a continuous ring surrounding the two terminal openings 42*a*. In FIG. 14, the guiding projection portion 43 and the circulatory projection portion 44 each have a rectangular shape in plan view. In this variation 1-10, corners of the guiding projection portion 43 and the circulatory projection portion 44 may be rounded or chamfered. The guiding projection portion 43 and the circulatory projection portion 44 may each have an oval shape or a circular shape in plan view.

In this variation 1-10, too, as is the case with variation 1-9, the semiconductor device 1*j* reduces the amount of sealing material 36 that flows to the terminal openings 42*a* more reliably than any of the other semiconductor devices and delays the time when the sealing material 36 reaches the terminal openings 42*a*. Therefore, less sealing material 36 seeps from the terminal openings 42*a* and more time is needed for the sealing material 36 to seep from the terminal openings 42*a*.

The semiconductor device 1*j* may include three or more terminal openings 42*a*. In this case, too, the guiding projection portion 43 and the circulatory projection portion 44 may each be formed in a continuous ring surrounding all the terminal openings 42*a*. A set of a guiding projection portion 43 and a circulatory projection portion 44 may be formed in a continuous ring surrounding one terminal opening 42*a*, and another set of a guiding projection portion 43 and a circulatory projection portion 44 may be formed in a continuous ring surrounding the other terminal opening 42*a*. In this case, too, the same advantageous effects as those according to variation 1-9 are obtained.

SECOND EMBODIMENT

Figure 15:
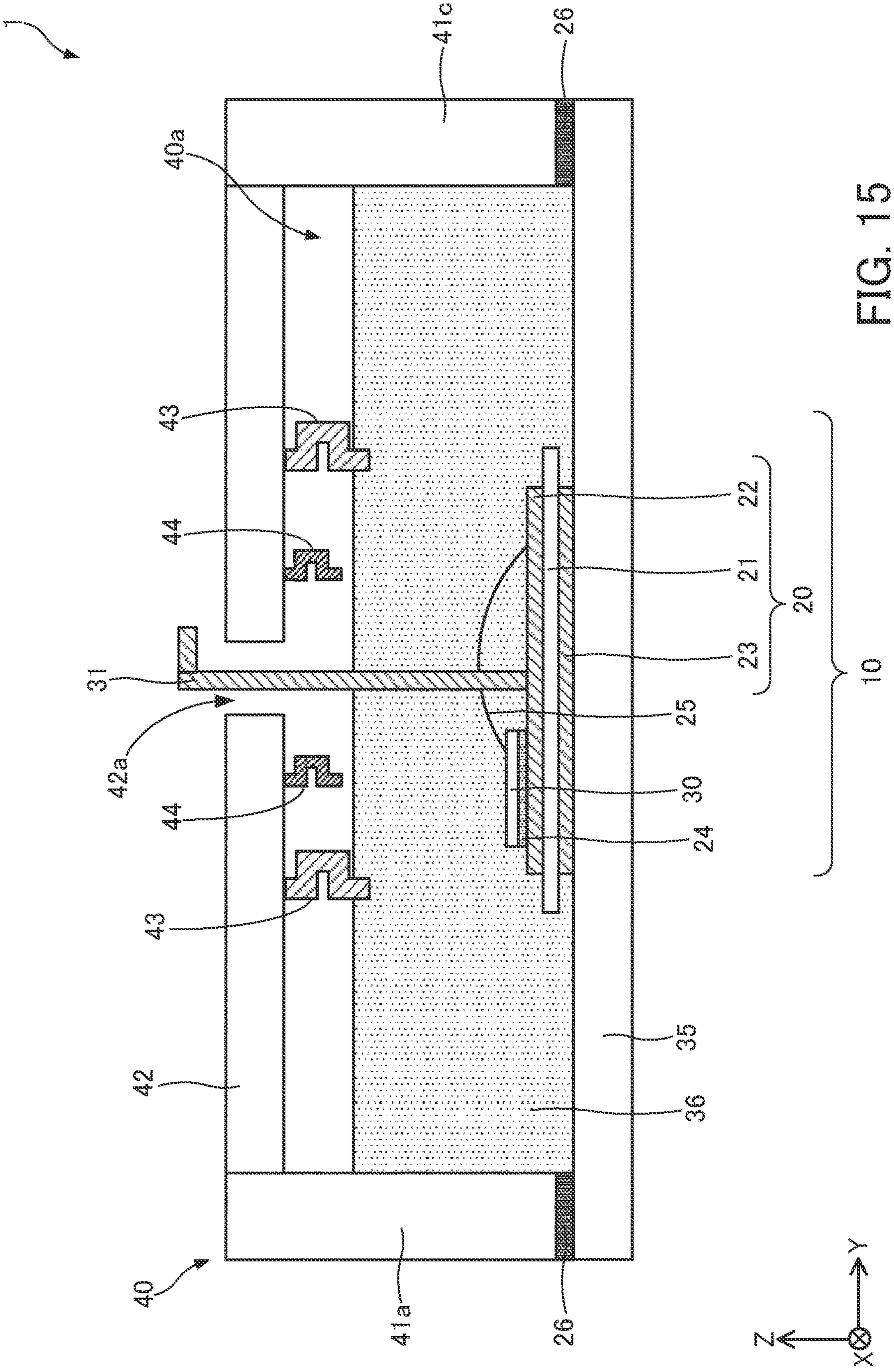
FIG. 15 is a side sectional view of a semiconductor device according to a second embodiment.

A second embodiment will be described with reference to FIG. 15. A semiconductor device according to the second embodiment differs from the semiconductor device 1 according to the first embodiment described with reference to FIGS. 1 and 2 in that the guiding projection portions 43 and the circulatory projection portions 44 are shaped differently. FIG. 15 is a side sectional view of a semiconductor device 1 according to the second embodiment.

The guiding projection portions 43 and the circulatory projection portions 44 of the semiconductor device 1 each have a columnar shape and are each bent in a crank shape. In this case, too, the projecting end portions of the guiding projection portions 43 are into contact with the sealing material 36, and the circulatory projection portions 44 extend toward the sealing material 36 without being into contact with the sealing material 36.

Compared with the individual guiding projection portion 43 illustrated in FIGS. 1 and 2, the length of a side surface of the individual guiding projection portion 43 from the projecting end portion to the other end portion is longer. Compared with the guiding projection portions 43 illustrated in FIGS. 1 and 2, the sealing material 36 needs more time to rise on these guiding projection portions 43. That is, more time is needed for the sealing material 36 to rise on the guiding projection portions 43, flow on the cover portion 42, and reach the terminal opening 42*a*.

Compared the with individual circulatory projection portion 44 illustrated in FIGS. 1 and 2, the length of a side surface of the individual circulatory projection portion 44 from the projecting end portion to the other end portion is longer. The sealing material 36 needs more time to be returned from the circulatory projection portions 44 to the storage area 40*a*, compared with the circulatory projection portions 44 illustrated in FIGS. 1 and 2. That is, the individual circulatory projection portions 44 hold the sealing material 36 for a longer time. Thus, the increase in the amount of sealing material 36 around the external connection terminal 31 is delayed, and rising of the sealing material 36 on the external connection terminal 31 is delayed. Therefore, less sealing material 36 seeps from the terminal opening 42*a*, and more time is needed for the sealing material 36 to seep from the terminal opening 42*a*. As a result, deterioration in the handleability of the semiconductor device 1 is prevented.

(Variation 2-1)

Figure 16:
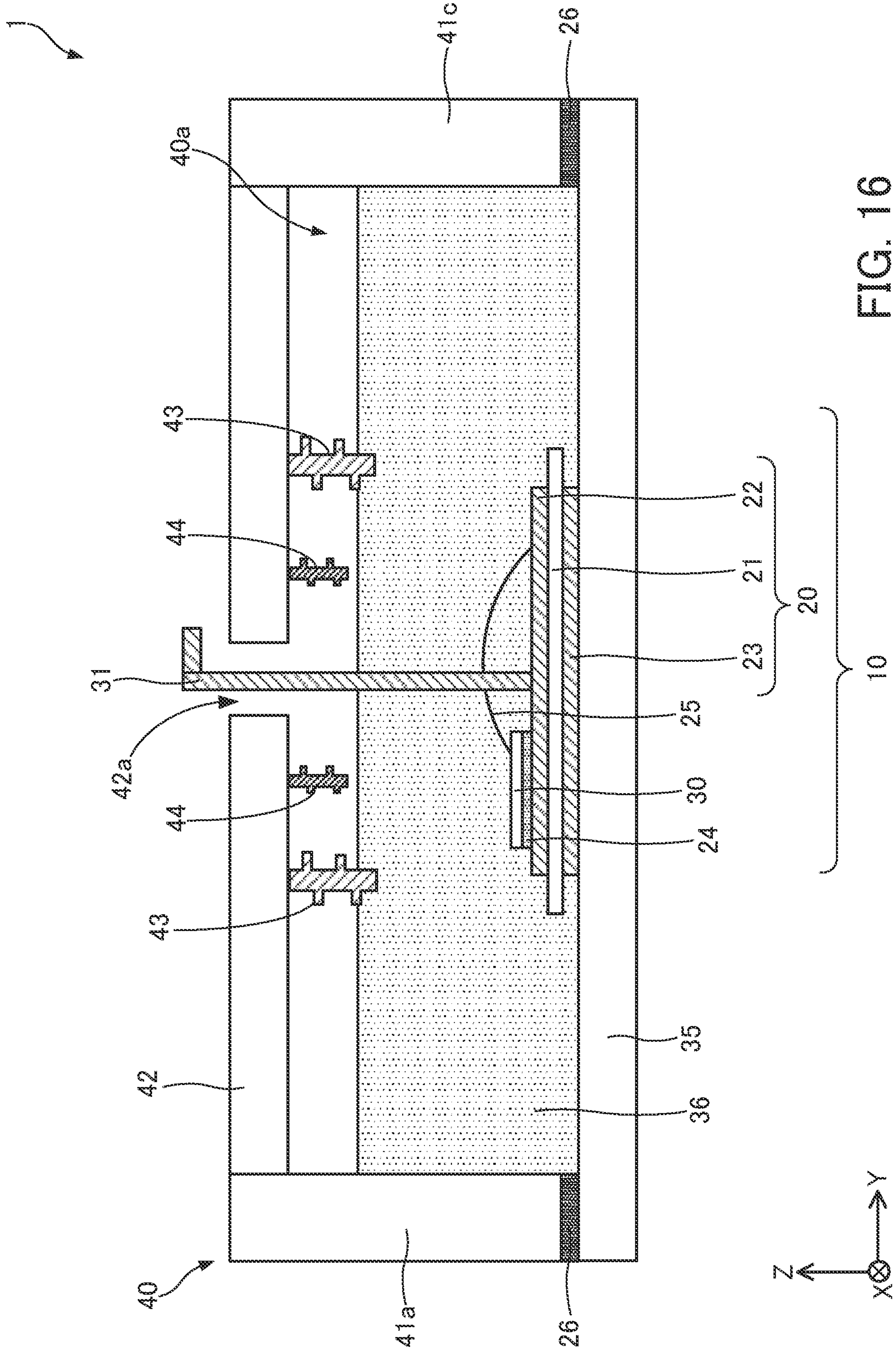
FIG. 16 is a side sectional view of a semiconductor device according to variation 2-1 of the second embodiment.

A semiconductor device 1 according to variation 2-1 will be described with reference to FIG. 16. This semiconductor device 1 differs from the semiconductor device 1 illustrated in FIG. 15 in that the guiding projection portions 43 and the circulatory projection portions 44 are shaped differently. FIG. 16 is a side sectional view of the semiconductor device 1 according to variation 2-1 of the second embodiment.

The guiding projection portions 43 and the circulatory projection portions 44 of the semiconductor device 1 each have a columnar shape and each have side surfaces on which a plurality of protrusions are formed. These protrusions may each have a columnar shape, a conical shape, a prismatic shape, or a hemispherical shape.

These guiding projection portions 43 and circulatory projection portions 44 each have a larger surface area than the guiding projection portions 43 and the circulatory projection portions 44 illustrated in FIGS. 1 and 2. That is, the length of a side surface of each of the guiding projection portions 43 and the circulatory projection portions 44 from the projecting end portion to the other end portion is longer. Thus, the same advantageous effects as those described with FIG. 15 are obtained.

(Variation 2-2)

Figure 17:
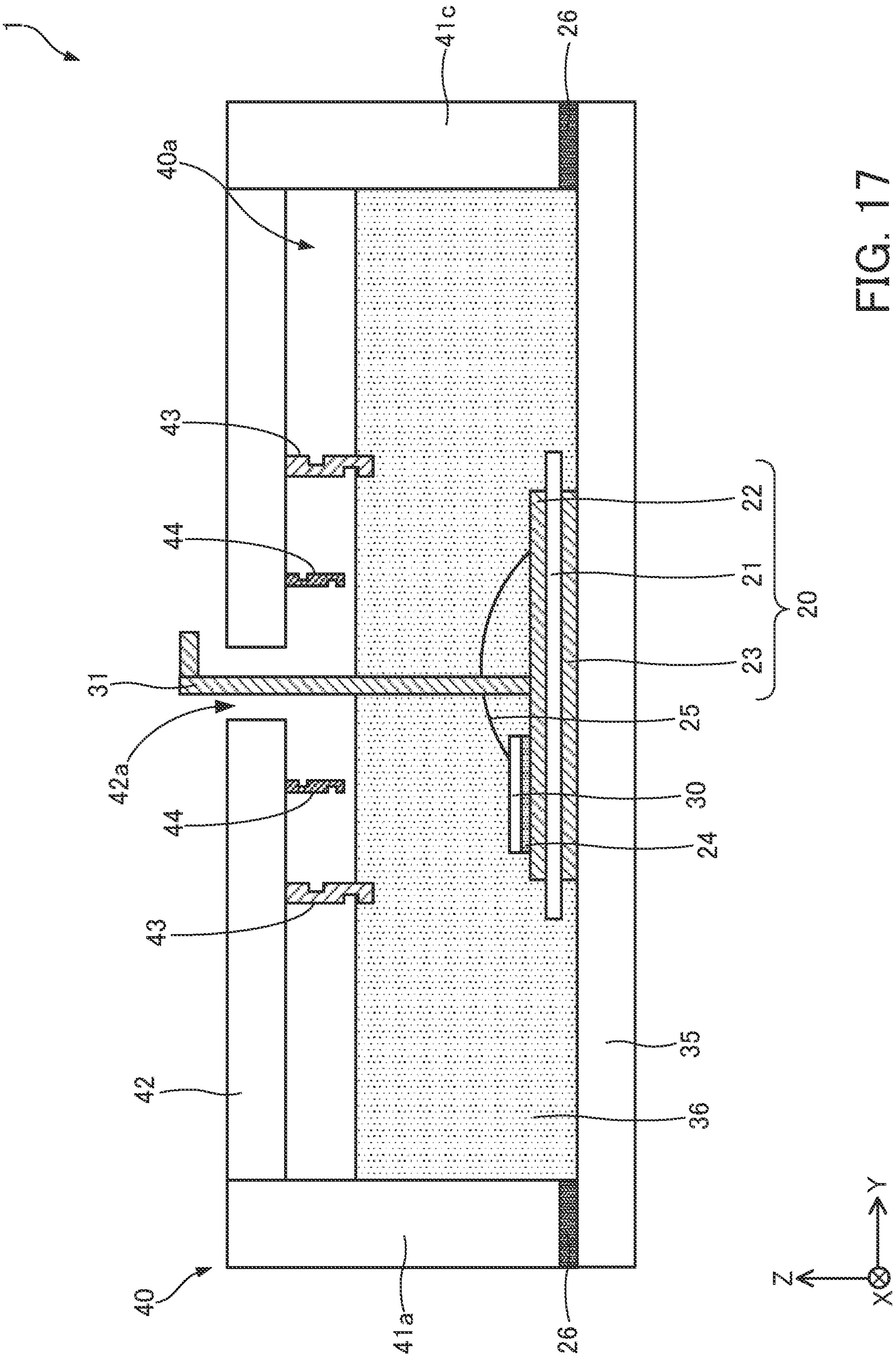
FIG. 17 is a side sectional view of a semiconductor device according to variation 2-2 of the second embodiment.

A semiconductor device 1 according to variation 2-2 will be described with reference to FIG. 17. This semiconductor device 1 differs from the semiconductor device 1 illustrated in FIG. 15 in that the guiding projection portions 43 and circulatory projection portions 44 are shaped differently. FIG. 17 is a side sectional view of the semiconductor device 1 according to variation 2-2 of the second embodiment.

The guiding projection portions 43 and the circulatory projection portions 44 of the semiconductor device 1 each have a columnar shape and each have side surfaces in which a plurality of concave portions are formed. These concave portions are dents in the side surfaces. The number of concave portions to be formed and the sizes of the concave portions may be set freely.

Compared with these guiding projection portions 43 and circulatory projection portions 44 illustrated in FIGS. 1 and 2, the length of a side surface of each of the guiding projection portions 43 and the circulatory projection portions 44 from the projecting end portion to the other end portion is longer. Thus, the same advantageous effects as those described with FIG. 15 are obtained.

The crank shapes, protrusions, and concave portions according to the second embodiment, variation 2-1, and variation 2-2 may be applied not only to the semiconductor device 1 in FIGS. 1 and 2 but also to the individual guiding projection portion 43 and the individual circulatory projection portion 44 according to variation 1-1 to variation 1-8. In addition, the protrusions may be applied to the main surfaces of the guiding projection portion 43 and the circulatory projection portion 44 according to variation 1-9 and variation 1-10.

The present technique disclosed herein prevents seeping of sealing material and deterioration in the handleability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
- a board;
- a semiconductor module disposed on a front surface of the board;
- a case that includes:
  - side wall portions that are disposed on the front surface of the board, and that surround, with the board, a storage area in which the semiconductor module is disposed,
  - a cover portion that is disposed on the side wall portions to cover the storage area, the cover portion having a terminal opening formed therein, and
  - two guiding projection portions formed on an inner surface of the case, and protruding toward the storage area from an upper portion of the case, the two guiding projection portions being on two opposite sides of the terminal opening, respectively, and not being in direct contact with each other; and
- sealing material with which the storage area is filled to thereby seal the semiconductor module, wherein
- each of the guiding projection portions has a projecting end portion that is in contact with the sealing material.

2. The semiconductor device according to claim 1, wherein the projecting end portion of each guiding projection portion extends below a sealing surface of the sealing material by 1 mm or more and 10 mm or less.

3. The semiconductor device according to claim 1, wherein each guiding projection portion is away from the side wall portions in a plan view of the semiconductor device.

4. The semiconductor device according to claim 1, wherein
- the semiconductor module includes an external connection terminal, and
- the external connection terminal has
  - an inner-side terminal that is directly bonded to the semiconductor module, and
  - an outer-side terminal that extends out of the case through the terminal opening.

5. The semiconductor device according to claim 1, further comprising a circulatory projection portion that is formed on the inner surface of the cover portion and between the terminal opening and one of the guiding projection portions in a plan view of the semiconductor device, and that protrudes toward the storage area without being in contact with the sealing material.

6. The semiconductor device according to claim 5, wherein the circulatory projection portion has a projecting end portion that is located 1 mm or more and 10 mm or less above a sealing surface of the sealing material.

7. The semiconductor device according to claim 5, wherein the guiding projection portions and the circulatory projection portion each have a columnar shape.

8. The semiconductor device according to claim 7, wherein the guiding projection portions and the circulatory projection portion each have a side portion on which at least a convex portion or a concave portion is formed.

9. The semiconductor device according to claim 7, further comprising:
- a plurality of the guiding projection portions, including said two guiding projection portions, formed to surround the terminal opening in the plan view,
- wherein the circulatory projection portion is provided in plurality, and
- wherein each of the plurality of circulatory projection portions is formed between one of the guiding projection portions and the terminal opening in the plan view.

10. The semiconductor device according to claim 7,
- wherein the circulatory projection portion is provided in plurality, and
- wherein each of the plurality of circulatory projection portions is formed between one of the guiding projection portions and the terminal opening, and along a line connecting said one guiding projection portion and the terminal opening, in the plan view.

11. The semiconductor device according to claim 5, wherein the guiding projection portions and the circulatory projection portion each have a crank shape.

12. The semiconductor device according to claim 5,
- wherein said one of the guiding projection portions and the circulatory projection portion each have a shape of a plate, the plate being straight or arched in the plan view, and having a main surface facing the terminal opening.

13. The semiconductor device according to claim 5, wherein the cover portion, the guiding projection portions, and the circulatory projection portion are made of a same material.

14. The semiconductor device according to claim 13, wherein the guiding projection portions and the circulatory projection portion are formed integrally with the cover portion.

15. The semiconductor device according to claim 1, wherein the sealing material is silicone gel.

16. The semiconductor device according to claim 1, wherein the projecting end portion is a first projecting end portion, at least one of the two guiding projection portions has a second projecting end portion different from the first projecting end portion, the second projecting end portion extends in a first direction parallel to the board, and the first projecting end portion extends in a second direction perpendicular to the board.

17. The semiconductor device according to claim 1, further comprising an external terminal that penetrates the terminal opening, with a gap formed between the external terminal and the case in the terminal opening, the gap being a void.

18. The semiconductor device according to claim 1, wherein each of the guiding projection portions has a projecting end portion that is in contact with the sealing material, and a bottommost surface of at least one of the two projecting end portions is in contact with the sealing material.

19. A semiconductor device, comprising:

a board;

a semiconductor module disposed on a front surface of the board;

a case that includes:

side wall portions that are disposed on the front surface of the board, and that surround, with the board, a storage area in which the semiconductor module is disposed, a cover portion that is disposed on the side wall portions to cover the storage area, the cover portion having a terminal opening formed therein, and a guiding projection portion formed on an inner surface of the cover portion, and protruding toward the storage area;

sealing material with which the storage area is filled to thereby seal the semiconductor module; and a circulatory projection portion that is formed on the inner surface of the cover portion and between the terminal opening and the guiding projection portion in a plan view of the semiconductor device, and that protrudes toward the storage area without being in contact with the sealing material, wherein the guiding projection portion has a projecting end portion that is in contact with the sealing material, wherein the guiding projection portion continuously and fully surround the terminal opening in the plan view, and wherein the circulatory projection portion continuously and fully surround the terminal opening, and is between the guiding projection portion and the terminal opening, in the plan view.

* * * * *